(12) United States Patent  
Chen et al.

(10) Patent No.: US 12,204,717 B2  
(45) Date of Patent: Jan. 21, 2025

(54) SYSTEMS AND METHODS FOR FLEX CIRCUIT CONNECTIONS IN TOUCH SCREENS

(71) Applicant: Apple Inc., Cupertino, CA (US)

(72) Inventors: Meng-Tse Chen, Hsinchu (TW); Arnoldus Alvin Barlian, San Francisco, CA (US); Bayu Atmaja Thedjoisworo, Palo Alto, CA (US); Boris Russ, San Jose, CA (US); Ziyang Zhang, Foster City, CA (US); Nathan Krishan Gupta, Hillsborough, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/266,254

(22) PCT Filed: Dec. 9, 2020

(86) PCT No.: PCT/CN2020/134899  
§ 371 (c)(1),  
(2) Date: Jun. 8, 2023

(87) PCT Pub. No.: WO2022/120636  
PCT Pub. Date: Jun. 16, 2022

(65) Prior Publication Data  
US 2024/0045539 A1 Feb. 8, 2024

(51) Int. Cl.  
*G06F 3/041* (2006.01)  
*G06F 3/044* (2006.01)  
(Continued)

(52) U.S. Cl.  
CPC ........ *G06F 3/04164* (2019.05); *G06F 3/0445* (2019.05); *G06F 3/0446* (2019.05);  
(Continued)

(58) Field of Classification Search  
CPC ....... G06F 3/04164; G06F 3/044–0448; G06F 2203/04102–04103; H05K 1/028; H05K 1/115; H05K 2201/10128  
See application file for complete search history.

(56) References Cited

U.S. PATENT DOCUMENTS

| | | |
|---|---|---|
| 5,876,427 A | 3/1999 | Chen et al. |
| 8,026,903 B2 | 9/2011 | Hamblin et al. |

(Continued)

FOREIGN PATENT DOCUMENTS

| | | |
|---|---|---|
| CN | 202281986 U | 6/2012 |
| CN | 103260334 A | 8/2013 |

(Continued)

OTHER PUBLICATIONS

Final Office Action received for U.S. Appl. No. 16/712,339, mailed on Jul. 11, 2022, 12 pages.

(Continued)

*Primary Examiner* — Hang Lin  
(74) *Attorney, Agent, or Firm* — Kubota & Basol LLP

(57) ABSTRACT

A touch screen (500) can include electrodes (520, 540) (e.g., first and second touch electrodes, reference electrodes) on opposite sides (e.g., top and bottom) of a substrate (510). In some examples, vias (618, 638) can be used to couple the touch electrodes (520, 540) to conductive connections (518, 538) of flex circuits (502, 522) such that the connections (604, 624) to the flex circuits (502, 522) can be on the same side of the substrate (510) even if the touch electrodes (520, 540) are on opposite sides of the substrate (510). The conductive filling material of the via (618) can make direct contact with the conductive connections (604, 624) of the flex circuits (502, 522), for example.

18 Claims, 18 Drawing Sheets

(51) Int. Cl.
  *H05K 1/02* (2006.01)
  *H05K 1/11* (2006.01)
(52) U.S. Cl.
  CPC .............. *H05K 1/028* (2013.01); *H05K 1/115* (2013.01); *H05K 2201/10128* (2013.01)

(56) References Cited

U.S. PATENT DOCUMENTS

| | | |
|---|---|---|
| 8,358,276 B2 | 1/2013 | Hotelling et al. |
| 8,549,738 B2 | 10/2013 | Grunthaner |
| 8,693,202 B2 | 4/2014 | Yoshifusa |
| 8,730,179 B2 | 5/2014 | Rosenblatt et al. |
| 9,084,357 B2 | 7/2015 | Shedletsky et al. |
| 9,160,332 B2 | 10/2015 | Guard |
| 9,235,286 B2 | 1/2016 | Nakano et al. |
| 9,515,128 B2 | 12/2016 | Kang et al. |
| 9,658,490 B2 | 5/2017 | Kao et al. |
| 9,874,961 B2 | 1/2018 | Chaturvedi et al. |
| 9,939,973 B2 | 4/2018 | Kim et al. |
| 9,939,978 B2 | 4/2018 | Chen et al. |
| 10,025,356 B2 | 7/2018 | Kang et al. |
| 10,054,988 B2 | 8/2018 | Jin et al. |
| 10,403,703 B2 | 9/2019 | Yamazaki |
| 10,658,450 B2 | 5/2020 | Chen et al. |
| 11,853,515 B2 | 12/2023 | Weisse et al. |
| 2002/0008809 A1 | 1/2002 | Babuka et al. |
| 2008/0158181 A1 | 7/2008 | Hamblin et al. |
| 2009/0283300 A1 | 11/2009 | Grunthaner |
| 2010/0302201 A1 | 12/2010 | Ritter et al. |
| 2011/0094670 A1 | 4/2011 | Grunthaner |
| 2011/0279409 A1 | 11/2011 | Salaverry et al. |
| 2013/0021297 A1 | 1/2013 | Lee |
| 2013/0088671 A1 | 4/2013 | Drzaic et al. |
| 2014/0145977 A1 | 5/2014 | Kang |
| 2014/0192277 A1 | 7/2014 | Yilmaz et al. |
| 2014/0375907 A1 | 12/2014 | Wu |
| 2015/0160760 A1 | 6/2015 | Sato |
| 2015/0162388 A1 | 6/2015 | Kim |
| 2015/0234486 A1 | 8/2015 | Huang et al. |
| 2015/0241906 A1 | 8/2015 | Tsai et al. |
| 2016/0011689 A1 | 1/2016 | Kim et al. |
| 2016/0054825 A1 | 2/2016 | Fried |
| 2016/0155967 A1 | 6/2016 | Lee et al. |
| 2016/0204366 A1 | 7/2016 | Zhang et al. |
| 2016/0370827 A1 | 12/2016 | Jin et al. |
| 2017/0048990 A1 | 2/2017 | Sim et al. |
| 2017/0064826 A1 | 3/2017 | Park et al. |
| 2017/0090661 A1 | 3/2017 | Kim et al. |
| 2017/0154842 A1 | 6/2017 | Manusharow et al. |
| 2017/0170255 A1 | 6/2017 | Ha et al. |
| 2017/0269737 A1 | 9/2017 | Zou et al. |
| 2017/0336831 A1 | 11/2017 | Zhang et al. |
| 2017/0371441 A1 | 12/2017 | Heikkinen et al. |
| 2018/0032184 A1 | 2/2018 | Huang et al. |
| 2018/0052554 A1* | 2/2018 | Zhang .................. G06F 3/0412 |
| 2018/0157354 A1 | 6/2018 | Blondin et al. |
| 2018/0232554 A1 | 8/2018 | Benkley et al. |
| 2018/0341355 A1* | 11/2018 | Li ......................... G06F 3/0412 |
| 2018/0342568 A1 | 11/2018 | Jin et al. |
| 2019/0011754 A1 | 1/2019 | Chen |
| 2019/0035869 A1 | 1/2019 | Kim |
| 2019/0102011 A1 | 4/2019 | Schultz et al. |
| 2019/0204669 A1 | 7/2019 | Lee et al. |
| 2019/0369761 A1 | 12/2019 | Guard et al. |
| 2020/0064972 A1* | 2/2020 | Yen ...................... G06F 3/04164 |
| 2020/0142540 A1 | 5/2020 | Rahmani et al. |
| 2020/0142542 A1 | 5/2020 | Kuriki et al. |
| 2020/0201482 A1 | 6/2020 | Weisse et al. |
| 2021/0255734 A1* | 8/2021 | Xie ...................... G06F 3/04164 |
| 2024/0134485 A1 | 4/2024 | Weisse et al. |

FOREIGN PATENT DOCUMENTS

| | | |
|---|---|---|
| CN | 103440066 A | 12/2013 |
| CN | 106066728 A | 11/2016 |
| CN | 107491221 A | 12/2017 |
| JP | 2003-248441 A | 9/2003 |
| JP | 2012-018634 A | 1/2012 |
| JP | 2014-149608 A | 8/2014 |
| KR | 10-2004-0048695 A | 6/2004 |
| KR | 10-2008-0046371 A | 5/2008 |
| KR | 100871329 B1 | 12/2008 |
| KR | 10-2012-0131876 A | 12/2012 |
| KR | 101365960 B1 | 2/2014 |
| KR | 10-2017-0039004 A | 4/2017 |
| KR | 10-2017-0041807 A | 4/2017 |
| KR | 10-2018-0077625 A | 7/2018 |
| WO | 2014/134894 A1 | 9/2014 |
| WO | 2016/055897 A1 | 4/2016 |

OTHER PUBLICATIONS

Final Office Action received for U.S. Appl. No. 16/712,339, mailed on Jun. 4, 2021, 14 pages.
Final Office Action received for U.S. Appl. No. 16/661,847, mailed on Dec. 8, 2020, 16 pages.
International Search Report received for PCT Patent Application No. PCT/CN2020/134899, mailed on May 27, 2021, 7 pages.
Non-Final Office Action received for U.S. Appl. No. 16/661,847, mailed on Jun. 11, 2020, 14 pages.
Non-Final Office Action received for U.S. Appl. No. 16/712,339, mailed on Dec. 6, 2021, 15 pages.
Non-Final Office Action received for U.S. Appl. No. 16/712,339, mailed on Jan. 26, 2023, 12 pages.
Non-Final Office Action received for U.S. Appl. No. 16/712,339, mailed on Oct. 29, 2020, 12 pages.
Notice of Allowance received for U.S. Appl. No. 16/661,847, mailed on May 13, 2021, 10 pages.
Search Report received for Chinese Patent Application No. 201911052197.2, mailed on Dec. 27, 2022, 6 pages (3 pages of English Translation and 3 pages of Official Copy).
Search Report received for Chinese Patent Application No. 201911279947.X, mailed on Jan. 20, 2023, 6 pages (3 pages of English Translation and 3 pages of Official Copy).
Search Report received for Chinese Patent Application No. 201911052197.2, mailed on May 22, 2023, 4 pages (2 pages of English Translation and 2 pages of Official Copy).
International Preliminary Report on Patentability received for PCT Patent Application No. PCT/CN2020/134899, mailed on Jun. 22, 2023, 8 pages.
Notice of Allowance received for U.S. Appl. No. 16/712,339, mailed on Aug. 16, 2023, 13 pages.
Non-Final Office Action received for U.S. Appl. No. 18/393,367, mailed on Jul. 11, 2024, 11 pages.

* cited by examiner

SYSTEMS AND METHODS FOR FLEX CIRCUIT CONNECTIONS IN TOUCH SCREENS

CROSS-REFERENCE TO RELATED APPLICATIONS

This application is a National Phase application under 35 U.S.C. § 371 of International Application No. PCT/CN2020/134899, filed Dec. 9, 2020, the content of which is herein incorporated by reference in its entirety for all purposes.

FIELD OF THE DISCLOSURE

This relates generally to touch screens and, more specifically, to flex circuits of touch screens.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are popular because of their ease and versatility of operation as well as their declining price. Touch screens can include a touch sensor panel, which can be a clear panel with a touch-sensitive surface, and a display device such as a liquid crystal display (LCD), light emitting diode (LED) display or organic light emitting diode (OLED) display that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface.

Capacitive touch sensor panels can be formed by a matrix of transparent, semi-transparent or non-transparent conductive plates made of materials such as Indium Tin Oxide (ITO). In some examples, the conductive plates can be formed from other materials including conductive polymers, metal mesh, graphene, nanowires (e.g., silver nanowires) or nanotubes (e.g., carbon nanotubes). In some implementations, due in part to their substantial transparency, some capacitive touch sensor panels can be overlaid on a display to form a touch screen, as described above. Some touch screens can be formed by at least partially integrating touch sensing circuitry into a display pixel stackup (i.e., the stacked material layers forming the display pixels).

In some examples, touch screens can include flex circuits that can couple one or more touch electrodes to touch circuitry (e.g., drive circuitry, sense circuitry). The flex circuits can be bonded to the touch screen at a location at which the flex circuits can be coupled to the touch electrodes. In some examples, a touch screen can include touch electrodes on opposite sides (e.g., top and bottom) of the substrate of the touch screen. In some examples, the touch screen can also include bonding locations on both sides of the substrate.

BRIEF SUMMARY OF THE DISCLOSURE

Embodiments described herein relate generally to touch screens and, more specifically, to flex circuits of touch screens. In some examples, the touch screen can include a first one or more touch electrodes on a first side (e.g., top side) of the substrate of the touch screen and a second one or more touch electrodes on a second side (e.g., bottom side) of the substrate of the touch screen. The touch screen can include vias that connect the touch electrodes to the flex circuits. In some examples, the vias can enable the connections to the flex circuits to be on the same side (e.g., top or bottom side) of the substrate even if the first and second touch electrodes are on opposite sides of the substrate. In some examples, connecting the touch electrodes to the flex circuits on the same side of the substrate can reduce the border or the thickness of the touch screen. In some examples, a touch screen can include touch electrodes on one side (e.g., the bottom side) of the substrate and reference electrodes on the other side (e.g., the top side) of the substrate and a via through the substrate to connect an electrode in the touch electrode layer to an electrode in the reference electrode layer.

In some examples, a touch screen can include first touch electrodes on a first side (e.g., the top side) of the substrate and second touch electrodes on a second side (e.g., the bottom side of the substrate). In some examples, the connections to the flex circuits for both the first and second electrodes can be on the first side of the substrate. In some examples, the connections to the flex circuits for both the first and second electrodes can be on the second side of the substrate. In some examples, the flex circuits can be bonded to the touch screen using an adhesive, and the vias can be formed through the adhesive. The conductive filling material of the vias can make direct contact with conductive connections (e.g., conductive traces) of the flex circuit without adhesive being disposed between the filling material of the vias and the flex circuit at the site of bonding, for example.

DETAILED DESCRIPTION OF THE DISCLOSURE

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Embodiments described herein relate generally to touch screens and, more specifically, to flex circuits of touch screens. In some examples, the touch screen can include a first one or more touch electrodes on a first side (e.g., top side) of the substrate of the touch screen and a second one or more touch electrodes on a second side (e.g., bottom side) of the substrate of the touch screen. The touch screen can include vias that connect the touch electrodes to the flex circuits. In some examples, the vias can enable the connections to the flex circuits to be on the same side (e.g., top or bottom side) of the substrate even if the first and second touch electrodes are on opposite sides of the substrate. In some examples, connecting the touch electrodes to the flex circuits on the same side of the substrate can reduce the border or the thickness of the touch screen. In some examples, a touch screen can include touch electrodes on one side (e.g., the bottom side) of the substrate and reference electrodes on the other side (e.g., the top side) of the substrate and a via through the substrate to connect an electrode in the touch electrode layer to an electrode in the reference electrode layer.

In some examples, a touch screen can include first touch electrodes on a first side (e.g., the top side) of the substrate and second touch electrodes on a second side (e.g., the bottom side of the substrate). In some examples, the connections to the flex circuits for both the first and second electrodes can be on the first side of the substrate. In some examples, the connections to the flex circuits for both the first and second electrodes can be on the second side of the substrate. In some examples, the flex circuits can be bonded to the touch screen using an adhesive, and the vias can be formed through the adhesive. The conductive filling material of the vias can make direct contact with conductive connections (e.g., conductive traces) of the flex circuit without adhesive being disposed between the filling material of the vias and the flex circuit at the site of bonding, for example.

Figure 1A:
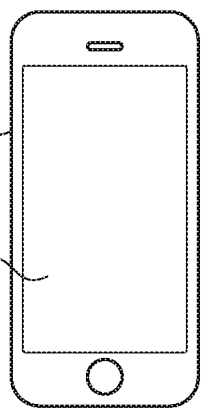
FIGS. 1A-1G illustrate example systems that can use flex circuit bonding techniques according to examples of the disclosure.
Figure 1B:
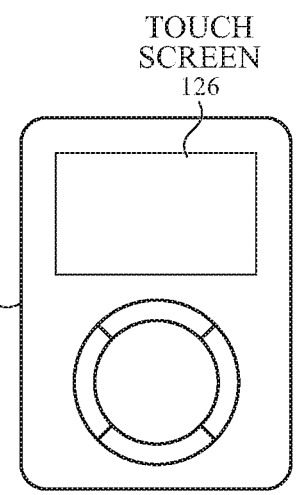
Figure 1C:
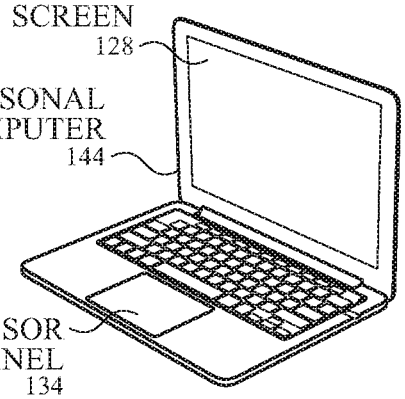
Figure 1D:
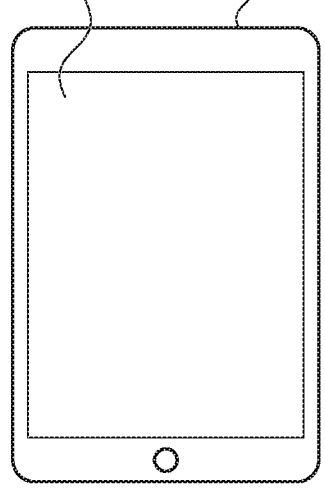
Figure 1E:
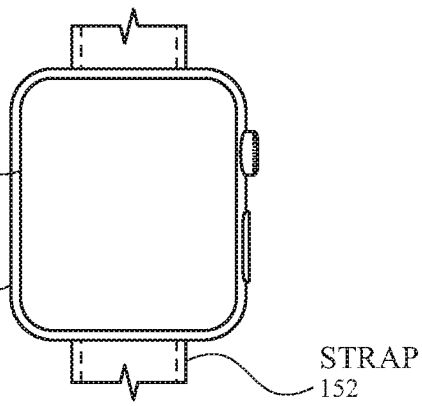
Figure 1F:
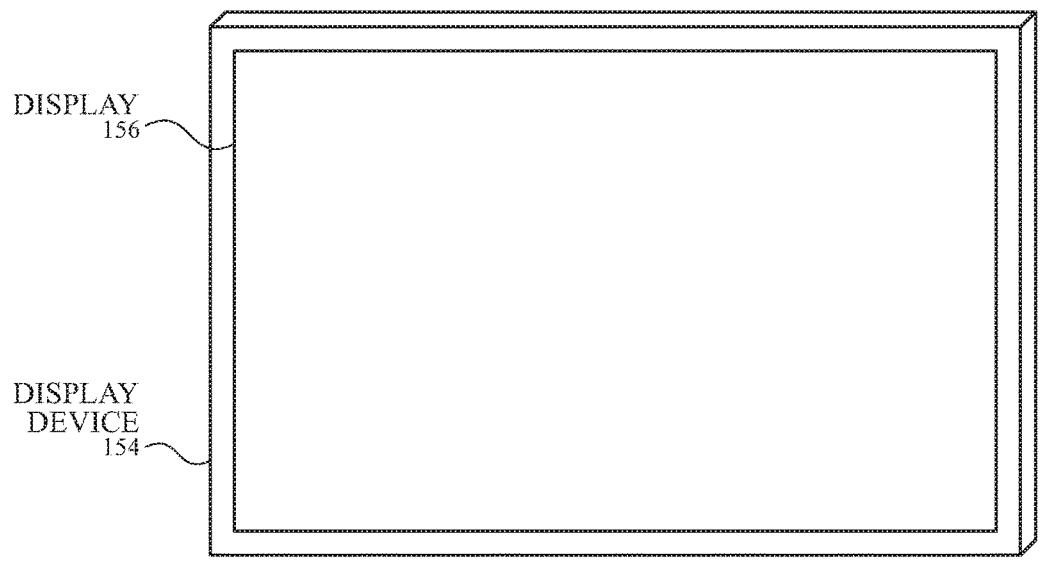
Figure 1G:
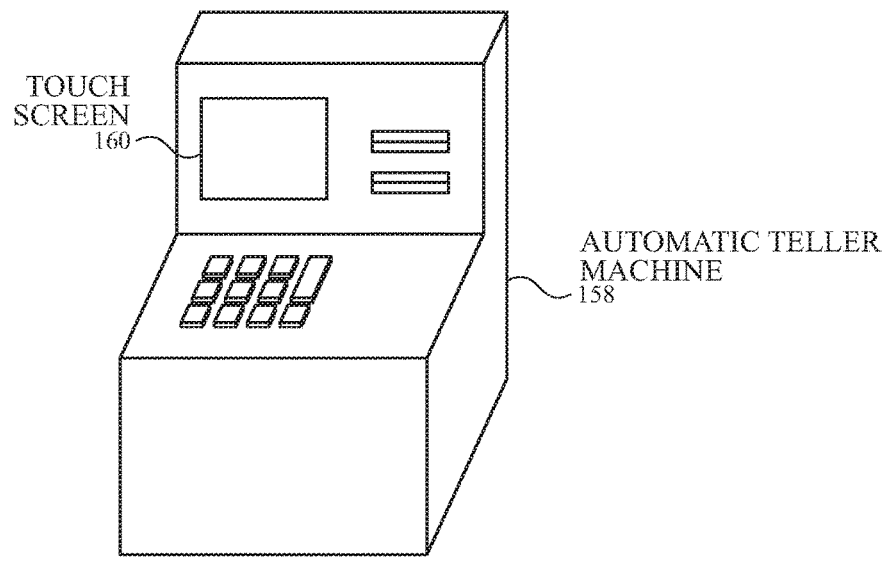

FIGS. 1A-1G illustrate example systems that can use flex circuit bonding techniques according to examples of the disclosure. FIG. 1A illustrates an example mobile telephone 136 that includes a touch screen 124 that can use flex circuit bonding techniques according to examples of the disclosure. FIG. 1B illustrates an example digital media player 140 that includes a touch screen 126 that can use flex circuit bonding techniques according to examples of the disclosure. FIG. 1C illustrates an example personal computer 144 that includes a touch screen 128 and a touch sensor panel 134 (e.g., a trackpad) that can use flex circuit bonding techniques according to examples of the disclosure. FIG. 1D illustrates an example tablet computing device 148 that includes a touch screen 130 that can use flex circuit bonding techniques according to examples of the disclosure. FIG. 1E illustrates an example wearable device 150 that includes a touch screen 132 and can be attached to a user using a strap 152 and that can use flex circuit bonding techniques according to examples of the disclosure. FIG. 1F illustrates an example display device 154 including display 156 that can use flex circuit bonding techniques according to examples of the disclosure. In some examples, display device 154 can be a television, computer monitor, large outdoor display, or another "large scale display" electronic device. In some examples, display 156 can be a touch screen. In some examples, display 156 can be a display that does not have touch sensing capabilities. FIG. 1G illustrates an example automatic teller machine 158 including touch screen 160 that can use flex circuit bonding techniques according to examples of the disclosure.

In some examples, touch screens 124, 126, 128, 130 and 132, touch sensor panels 134 and 138 and touch sensors 160 and 162 can be based on self-capacitance. A self-capacitance based touch system can include a matrix of small, individual plates of conductive material or groups of individual plates of conductive material forming larger conductive regions that can be referred to as touch electrodes or as touch node electrodes (as described below with reference to FIG. 4B). For example, a touch screen can include a plurality of individual touch electrodes, each touch electrode identifying or representing a unique location (e.g., a touch node) on the touch screen at which touch or proximity is to be sensed, and each touch node electrode being electrically isolated from the other touch node electrodes in the touch screen/panel. Such a touch screen can be referred to as a pixelated self-capacitance touch screen, though it is understood that in some examples, the touch node electrodes on the touch screen can be used to perform scans other than self-capacitance scans on the touch screen (e.g., mutual capacitance scans). During operation, a touch node electrode can be stimulated with an alternating current (AC) waveform, and the self-capacitance to ground of the touch node electrode can be measured. As an object approaches the touch node electrode, the self-capacitance to ground of the touch node electrode can change (e.g., increase). This change in the self-capacitance of the touch node electrode can be detected and measured by the touch sensing system to determine the positions of multiple objects when they touch, or come in proximity to, the touch screen. In some examples, the touch node electrodes of a self-capacitance based touch system can be formed from rows and columns of conductive material, and changes in the self-capacitance to ground of the rows and columns can be detected, similar to above. In some examples, a touch screen can support multi-touch, single touch, projection scan, etc., touch functionality.

In some examples, touch screens 124, 126, 128, 130, 132, and 160 touch sensor panel 134, and display 156 can be based on mutual capacitance. A mutual capacitance based touch system can include electrodes arranged as drive and sense lines (e.g., as described below with reference to FIG. 4A) that may cross over each other on different layers (in a double-sided configuration) or may be adjacent to each other on the same layer. The crossing or adjacent locations can form touch nodes. During operation, the drive line can be stimulated with an AC waveform and the mutual capacitance of the touch node can be measured. As an object approaches the touch node, the mutual capacitance of the touch node can change (e.g., decrease). This change in the mutual capacitance of the touch node can be detected and measured by the touch sensing system to determine the positions of multiple objects when they touch, or come in proximity to, the touch screen. As described herein, in some examples, a mutual capacitance based touch system can form touch nodes from a matrix of small, individual plates of conductive material.

In some examples, touch screens 124, 126, 128, 130, 132, and 160 touch sensor panel 134 and 138, and display 156 can be based on mutual capacitance and/or self-capacitance. The electrodes can be arrange as a matrix of small, individual plates of conductive material (e.g., as in touch node electrodes 408 in touch screen 402 in FIG. 4B) or as drive lines and sense lines (e.g., as in row touch electrodes 404 and column touch electrodes 406 in touch screen 400 in FIG. 4A), or in another pattern. The electrodes can be configurable for mutual capacitance or self-capacitance sensing or a combination of mutual and self-capacitance sensing. For example, in one mode of operation, electrodes can be configured to sense mutual capacitance between electrodes and in a different mode of operation electrodes can be configured to sense self-capacitance of electrodes. In some examples, some of the electrodes can be configured to sense mutual capacitance therebetween and some of the electrodes can be configured to sense self-capacitance thereof.

Figure 2:
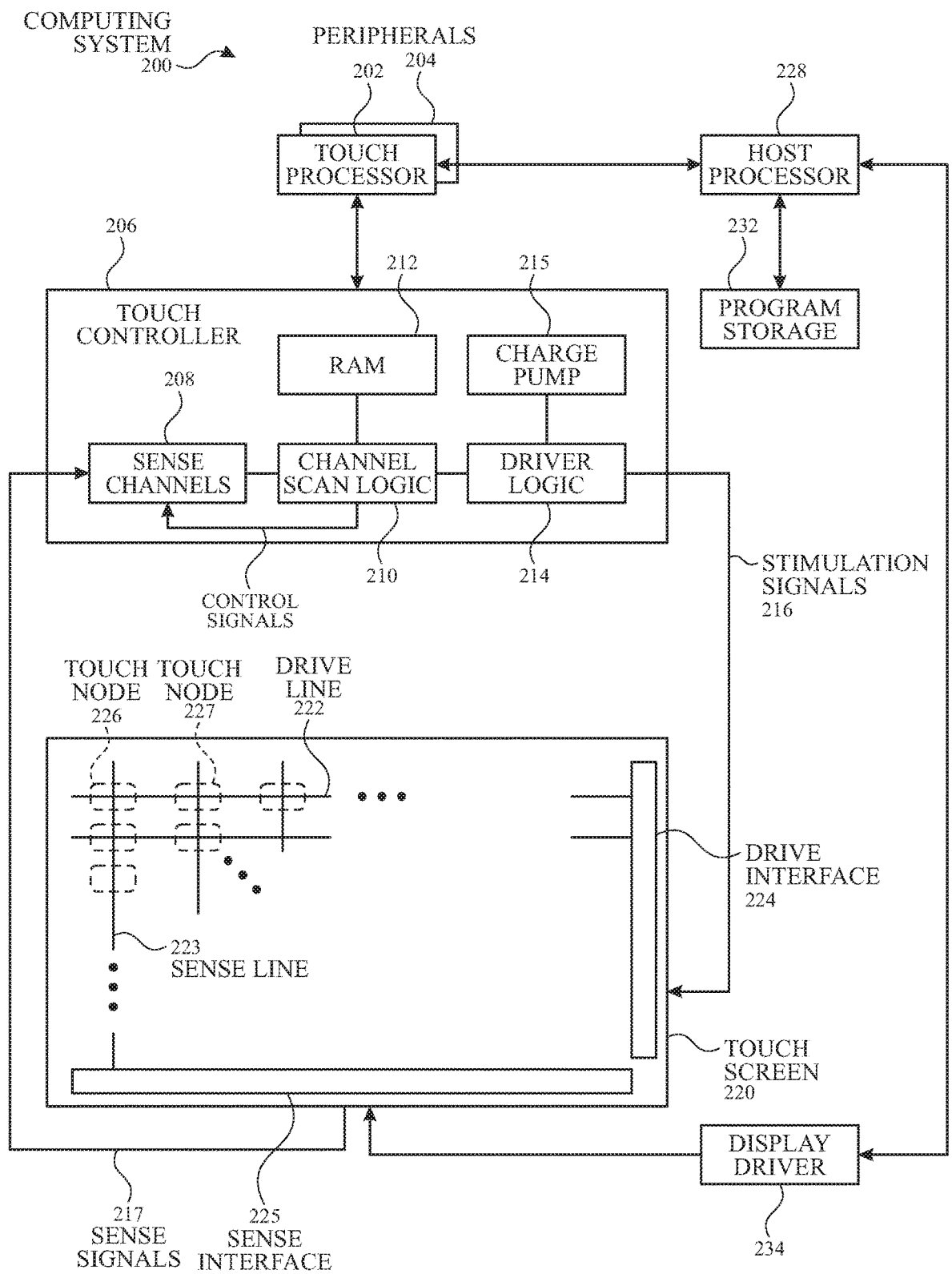
FIG. 2 illustrates an example computing system including a touch screen that can use flex circuit bonding techniques according to examples of the disclosure.

FIG. 2 illustrates an example computing system including a touch screen that can use flex circuit bonding techniques according to examples of the disclosure. Computing system 200 can be included in, for example, a mobile phone, tablet, touchpad, portable or desktop computer, portable media player, wearable device or any mobile or non-mobile computing device that includes a touch screen or touch sensor panel. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers, co-processor(s) and the like. Touch controller 206 can include, but is not limited to, one or more sense channels 208, channel scan logic 210 and driver logic 214. Channel scan logic 210 can access RAM 212, autonomously read data from the sense channels and provide control for the sense channels. In addition, channel scan logic 210 can control driver logic 214 to generate stimulation signals 216 at various frequencies and/or phases that can be selectively applied to drive regions of the touch sensing circuitry of touch screen 220, as described in more detail below. In some examples, touch controller 206, touch processor 202 and peripherals 204 can be integrated into a single application specific integrated circuit (ASIC), and in some examples can be integrated with touch screen 220 itself.

It should be apparent that the architecture shown in FIG. 2 is only one example architecture of computing system 200, and that the system could have more or fewer components than shown, or a different configuration of components. The various components shown in FIG. 2 can be implemented in hardware, software, firmware or any combination thereof, including one or more signal processing and/or application specific integrated circuits.

Computing system 200 can include a host processor 228 for receiving outputs from touch processor 202 and performing actions based on the outputs. For example, host processor 228 can be connected to program storage 232 and a display controller/driver 234 (e.g., a Liquid-Crystal Display (LCD) driver). It is understood that although some examples of the disclosure may described with reference to LCD displays, the scope of the disclosure is not so limited and can extend to other types of displays, such as Light-Emitting Diode (LED) displays, including Organic LED (OLED), Active-Matrix Organic LED (AMOLED) and Passive-Matrix Organic LED (PMOLED) displays. Display driver 234 can provide voltages on select (e.g., gate) lines to each pixel transistor and can provide data signals along data lines to these same transistors to control the pixel display image.

Host processor 228 can use display driver 234 to generate a display image on touch screen 220, such as a display image of a user interface (UI), and can use touch processor 202 and touch controller 206 to detect a touch on or near touch screen 220, such as a touch input to the displayed UI. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, capturing an image with a camera in communication with the electronic device, exiting an idle/sleep state of the electronic device, and/or the like. Host processor 228 can also perform additional functions that may not be related to touch processing.

Note that one or more of the functions described herein, including the configuration of switches, can be performed by firmware stored in memory (e.g., one of the peripherals 204 in FIG. 2) and executed by touch processor 202, or stored in program storage 232 and executed by host processor 228. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. In some examples, RAM 212 or program storage 232 (or both) can be a non-transitory computer readable storage medium. One or both of RAM 212 and program storage 232 can have stored therein instructions, which when executed by touch processor 202 or host processor 228 or both, can cause the device including computing system 200 to perform one or more functions and methods of one or more examples of this disclosure. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Touch screen 220 can be used to derive touch information at multiple discrete locations of the touch screen, referred to herein as touch nodes. Touch screen 220 can include touch sensing circuitry that can include a capacitive sensing medium having a plurality of drive lines 222 and a plurality of sense lines 223. It should be noted that the term "lines" is sometimes used herein to mean simply conductive pathways, as one skilled in the art will readily understand, and is not limited to elements that are strictly linear, but includes pathways that change direction, and includes pathways of different size, shape, materials, etc. Drive lines 222 can be driven by stimulation signals 216 from driver logic 214 through a drive interface 224 and resulting sense signals 217 generated in sense lines 223 can be transmitted through a sense interface 225 to sense channels 208 in touch controller 206. In this way, drive lines and sense lines can be part of the touch sensing circuitry that can interact to form capacitive sensing nodes, which can be thought of as touch picture elements (touch pixels) and referred to herein as touch nodes, such as touch nodes 226 and 227. This way of understanding can be particularly useful when touch screen 220 is viewed as capturing an "image" of touch ("touch image"). In other words, after touch controller 206 has determined whether a touch has been detected at each touch nodes in the touch screen, the pattern of touch nodes in the touch screen at which a touch occurred can be thought of as an "image" of touch (e.g., a pattern of fingers touching the touch screen). As used herein, an electrical component "coupled to" or "connected to" another electrical component encompasses a direct or indirect connection providing electrical path for communication or operation between the coupled components. Thus, for example, drive lines 222 may be directly connected to driver logic 214 or indirectly connected to drive logic 214 via drive interface 224 and sense lines 223 may be directly connected to sense channels 208 or indirectly connected to sense channels 208 via sense interface 225. In either case an electrical path for driving and/or sensing the touch nodes can be provided.

Figure 3A:
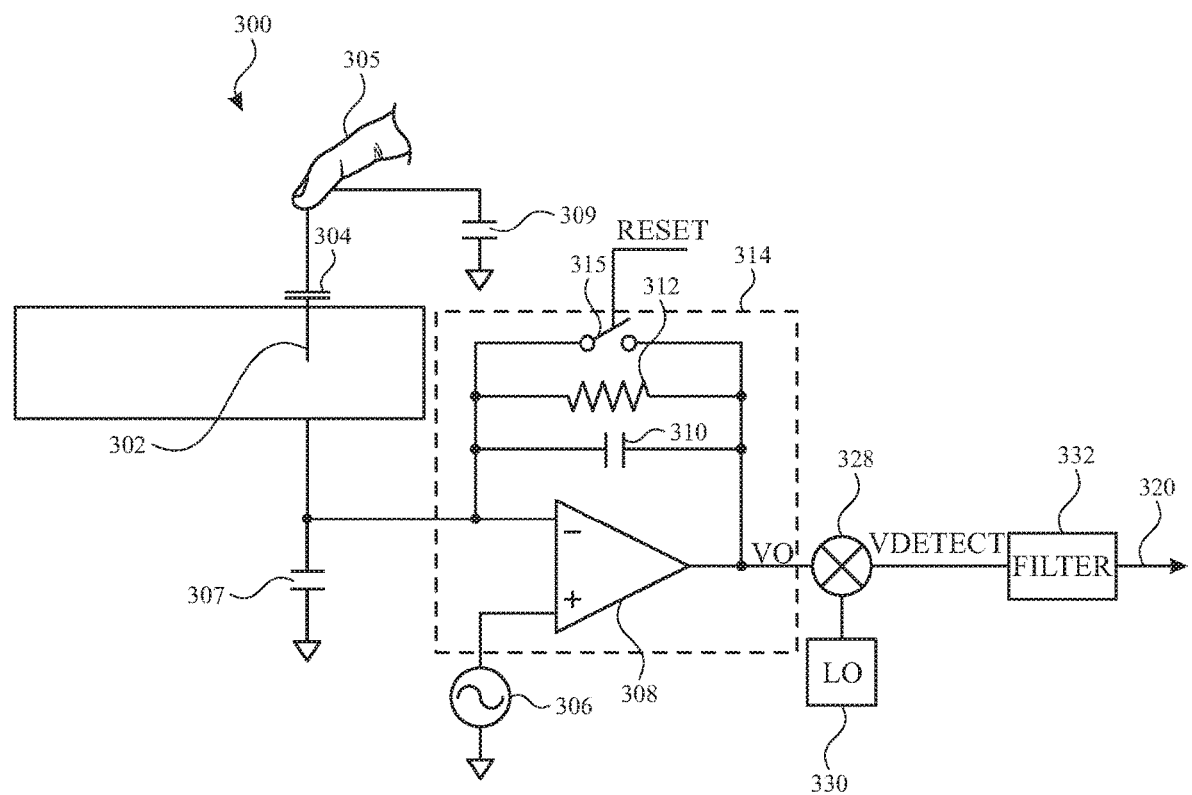
FIG. 3A illustrates an exemplary touch sensor circuit corresponding to a self-capacitance measurement of a touch node electrode and sensing circuit according to examples of the disclosure.

FIG. 3A illustrates an exemplary touch sensor circuit corresponding to a self-capacitance measurement of a touch node electrode 302 and sensing circuit 314 (e.g., corresponding to a sense channel 208) according to examples of the disclosure. Touch node electrode 302 can correspond to a touch electrode 404 or 406 of touch screen 400 or a touch node electrode 408 of touch screen 402. Touch node electrode 302 can have an inherent self-capacitance to ground associated with it, and also an additional self-capacitance to ground that is formed when an object, such as finger 305, is in proximity to or touching the electrode. The total self-capacitance to ground of touch node electrode 302 can be approximated as capacitance 304 can be much smaller than the body capacitance 309 and thus can dominate the overall ground capacitance. Touch node electrode 302 can be coupled to sensing circuit 314. Sensing circuit 314 can include an operational amplifier 308, feedback resistor 312 and feedback capacitor 310, although other configurations can be employed. For example, feedback resistor 312 can be replaced by a switched capacitor resistor in order to minimize a parasitic capacitance effect that can be caused by a variable feedback resistor. Touch node electrode 302 can be coupled to the inverting input (−) of operational amplifier 308. An AC voltage source 306 ($V_{ac}$) can be coupled to the non-inverting input (+) of operational amplifier 308. Touch sensor circuit 300 can be configured to sense changes (e.g., increases) in the total self-capacitance 304 of the touch node electrode 302 induced by a finger or object either touching or in proximity to the touch sensor panel. The output voltage amplitude of amplifier 308 is approximately $V_{ac}*(1+X_{FB}/(X_{CS}+X_{CSNS}))$, where $X_{FB}$, $X_{CS}$ and $X_{CSNS}$ are the impedances of the feedback network, capacitors 307 and 304, respectively, at the frequency of $V_{ac}$. The output of the amplifier 308 can be demodulated at the frequency of stimulus signal $V_{ac}$ (homodyne or synchronous detection) by demodulator 328 and then integrated (or averaged) by filter 332. The resulting output 320 can be used by a processor to determine the presence of a proximity or touch event, or the output can be inputted into a discrete logic network to determine the presence of a proximity or touch event. Note that in some examples, demodulator can be an I/Q demodulator. In some examples, the demodulator can be in the digital domain, where the output of amplifier 308 could be digitized first by an ADC before performing digital demodulation.

Figure 3B:
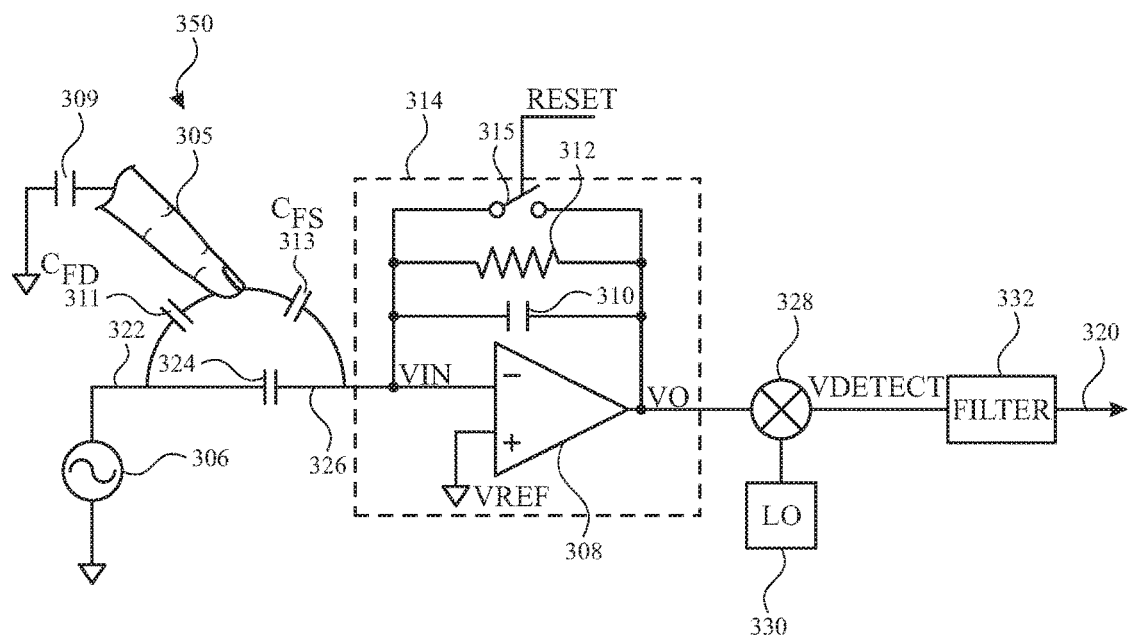
FIG. 3B illustrates an exemplary touch sensor circuit corresponding to a mutual-capacitance drive line and sense line and sensing circuit according to examples of the disclosure.

FIG. 3B illustrates an exemplary touch sensor circuit 350 corresponding to a mutual-capacitance drive line 322 and sense line 326 and sensing circuit 314 (e.g., corresponding to a sense channel 208) according to examples of the disclosure. Drive line 322 can be stimulated by stimulation signal 306 (e.g., an AC voltage signal). Stimulation signal 306 can be capacitively coupled to sense line 326 through mutual capacitance 324 between drive line 322 and the sense line. When a finger or object 305 approaches the touch node created by the intersection of drive line 322 and sense line 326, mutual capacitance 324 can change (e.g., decrease). This change in mutual capacitance 324 can be detected to indicate a touch or proximity event at the touch node, as described herein. The sense signal coupled onto sense line 326 can be received by sensing circuit 314. Sensing circuit 314 can include operational amplifier 308 and at least one of a feedback resistor 312 and a feedback capacitor 310. FIG. 3B illustrates a general case in which both resistive and capacitive feedback elements are utilized. The sense signal (referred to as $V_{in}$) can be inputted into the inverting input of operational amplifier 308, and the non-inverting input of the operational amplifier can be coupled to a reference voltage $V_{ref}$. Operational amplifier 308 can drive its output to voltage $V_o$ to keep $V_{in}$ substantially equal to $V_{ref}$, and can therefore maintain $V_{in}$ constant or virtually grounded. A person of skill in the art would understand that in this context, equal can include deviations of up to 15%. Therefore, the gain of sensing circuit 314 can be mostly a function of the ratio of mutual capacitance 324 and the feedback impedance, comprised of resistor 312 and/or capacitor 310, and the impedance of mutual capacitance 324. The output of the amplifier 308 is demodulated at the frequency of stimulus signal $V_{ac}$ (homodyne or synchronous detection) by demodulator 328 and then integrated (or averaged) by filter 332. Note that in some examples, demodulator can be an I/Q demodulator. In some examples, the demodulator (or I/Q demodulator) can be in the digital domain, where the output of amplifier 308 can be digitized first by an ADC before performing demodulation and filtering.

Referring back to FIG. 2, in some examples, touch screen 220 can be an integrated touch screen in which touch sensing circuit elements of the touch sensing system can be integrated into the display pixel stack-ups of a display. The circuit elements in touch screen 220 can include, for example, elements that can exist in LCD or other displays (LED display, OLED display, etc.), such as one or more pixel transistors (e.g., thin film transistors (TFTs)), gate lines, data lines, pixel electrodes and common electrodes. In a given display pixel, a voltage between a pixel electrode and a common electrode can control a luminance of the display pixel. The voltage on the pixel electrode can be supplied by a data line through a pixel transistor, which can be controlled by a gate line. It is noted that circuit elements are not limited to whole circuit components, such as a whole capacitor, a whole transistor, etc., but can include portions of circuitry, such as only one of the two plates of a parallel plate capacitor.

Figure 4B:
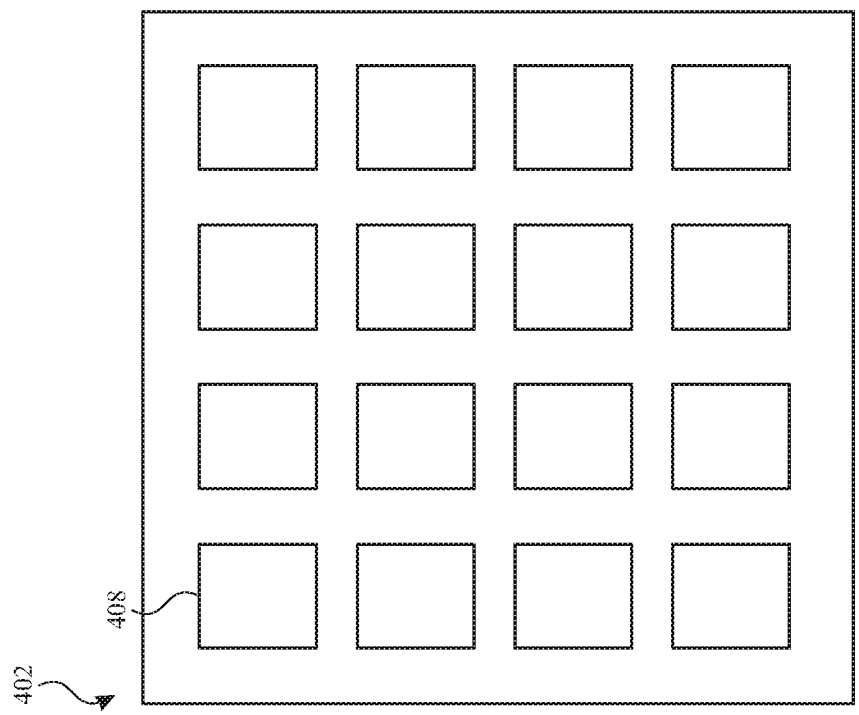
FIG. 4B illustrates touch screen with touch node electrodes arranged in a pixelated touch node electrode configuration according to examples of the disclosure.
Figure 4A:
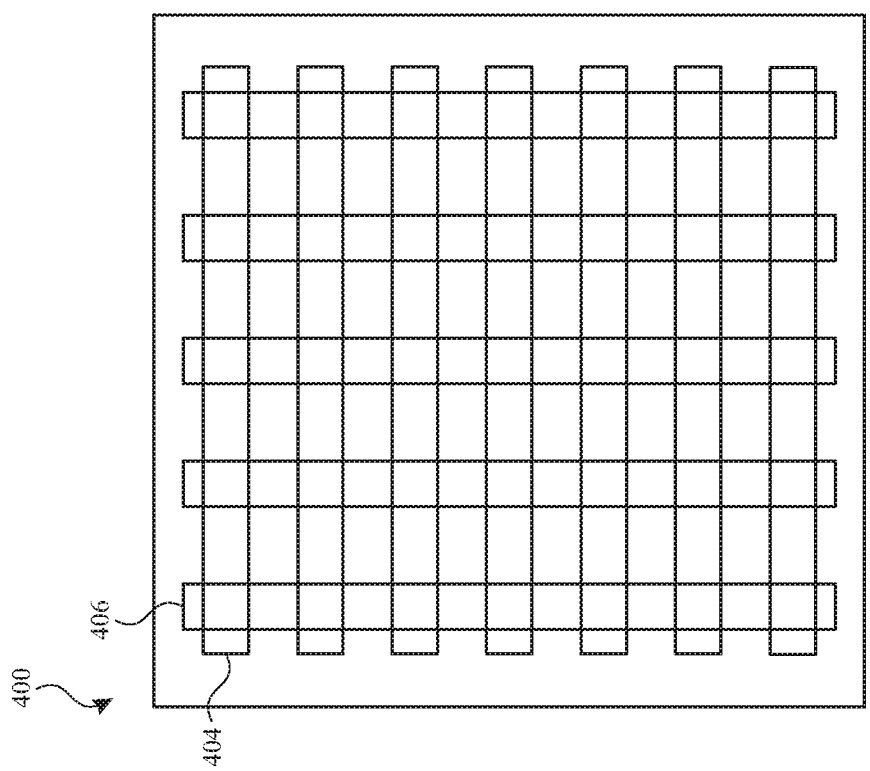
FIG. 4A illustrates touch screen with touch electrodes arranged in rows and columns according to examples of the disclosure.

FIG. 4A illustrates touch screen 400 with touch electrodes 404 and 406 arranged in rows and columns according to examples of the disclosure. Specifically, touch screen 400 can include a plurality of touch electrodes 404 disposed as rows, and a plurality of touch electrodes 406 disposed as columns. Touch electrodes 404 and touch electrodes 406 can be on the same or different material layers on touch screen 400, and can intersect with each other, as illustrated in FIG. 4A. In some examples, the electrodes can be formed on opposite sides of a transparent (partially or fully) substrate and from a transparent (partially or fully) semiconductor material, such as ITO, though other materials are possible. Electrodes displayed on layers on different sides of the substrate can be referred to herein as a double-sided sensor. In some examples, touch screen 400 can sense the self-capacitance of touch electrodes 404 and 406 to detect touch and/or proximity activity on touch screen 400, and in some examples, touch screen 400 can sense the mutual capacitance between touch electrodes 404 and 406 to detect touch and/or proximity activity on touch screen 400. Although the touch electrodes 404 and 406 are illustrated as being rectangle-shaped, it should be understood that other electrode shapes and structures (e.g., diamond-, square-, stripe- or circle-shaped electrodes connected by jumpers or vias) are possible.

FIG. 4B illustrates touch screen 402 with touch node electrodes 408 arranged in a pixelated touch node electrode configuration according to examples of the disclosure. Specifically, touch screen 402 can include a plurality of individual touch node electrodes 408, each touch node electrode identifying or representing a unique location on the touch screen at which touch or proximity (i.e., a touch or proximity event) is to be sensed, and each touch node electrode being electrically isolated from the other touch node electrodes in the touch screen/panel, as previously described. Touch node electrodes 408 can be on the same or different material layers on touch screen 402. In some examples, touch screen 402 can sense the self-capacitance of touch node electrodes 408 to detect touch and/or proximity activity on touch screen 402, and in some examples, touch screen 402 can sense the mutual capacitance between touch node electrodes 408 to detect touch and/or proximity activity on touch screen 402. Although touch node electrodes 408 are illustrated as having rectangular shapes, it should be understood that other electrode shapes (e.g., diamonds, circles, stripes etc.) and structures are possible.

Figure 5:
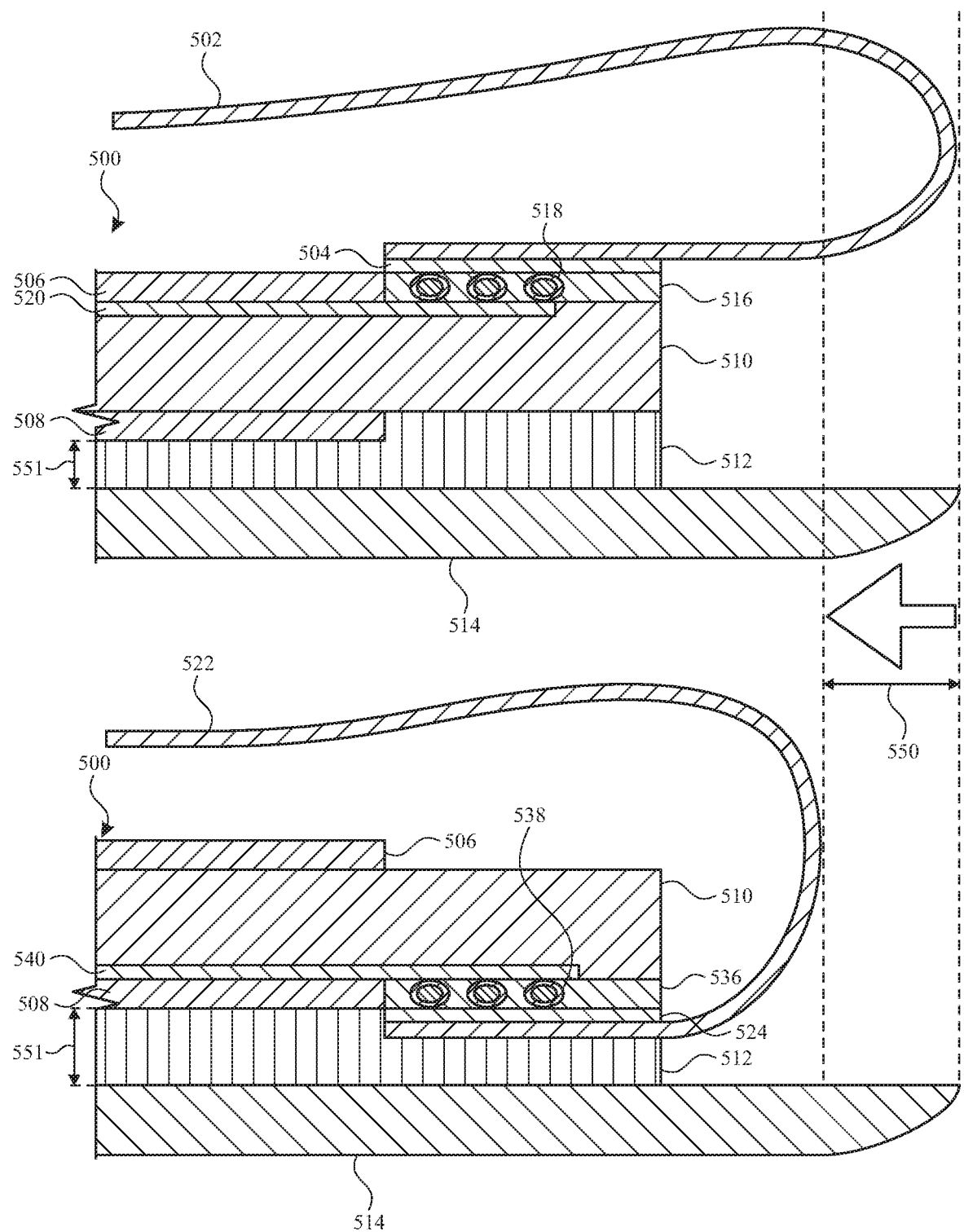
FIG. 5 illustrates cross-sections of an exemplary touch screen according to some examples of the disclosure.

FIG. 5 illustrates cross-sections of an exemplary touch screen 500 according to some examples of the disclosure. The two cross-sections illustrated in FIG. 5 can be at different locations (e.g., the locations at which flex circuits 502 and 522 are bonded to touch screen 500) of the same touch screen 500, for example. Touch screen 500 can include substrate 510, touch electrodes 520 (e.g., drive electrodes), touch electrodes 540 (e.g., sense electrodes), passivation layers 506 and 508, cover material 514, flex circuits 502 and 522, conductive connections 504 and 524, adhesives 516 and 536 with conductive particles 518 and 538, and adhesive 512, for example. As will be described in more detail below, touch screen 500 can include flex circuits 502 and 522 that are connected to the rest of the touch screen 500 on opposite sides (e.g., the top side and the bottom side) of substrate 510.

In some examples, substrate 510 can include a transparent material, such as a transparent plastic. Substrate 510 can provide mechanical support to the other components of the touch screen 500, for example. It should be understood that, in some examples, substrate 510 can include a plurality of substrates joined together with adhesives so that touch electrodes 520 are attached to one of the substrates and touch electrodes 540 are attached to the another one of the substrates.

In some examples, touch electrodes 520 (e.g., drive electrodes) and touch electrodes 540 (e.g., sense electrodes) can include a transparent conductive material, such as ITO (indium tin oxide) or another fully, substantially, or partially transparent metal oxide. In some examples, the electrodes 520 and 530 can include opaque conductive materials, such as metals (e.g., copper, gold, silver, etc.). For example, touch screen 500 can include an active area in which touch can be sensed and images can be displayed and a border region at least partially surrounding the active area in which images may not be displayed and touch may not be sensed. In some examples, the touch electrodes 520 and 530 can include transparent portions disposed in the active area and opaque portions disposed in the border region. In some examples, the portions of the touch electrodes illustrated in FIG. 5 can include opaque portions of the touch electrodes 520 and 530. In some examples, the touch electrodes 520 and touch electrodes 540 can include metal mesh structures, such as silver nanowire mesh. In some examples, the touch electrodes 520 and 540 can be used to sense touch using one or more of the mutual capacitance techniques described above. For example, a drive signal can be applied to touch electrodes 520 and a sense signal can be sensed from touch electrodes 540. In some examples, touch electrodes 520 can be the sense electrodes and touch electrodes 540 can be the drive electrodes. In some examples, the touch electrodes 520 and 540 can be used to sense touch using one or more of the self-capacitance techniques described above.

In some examples, flex circuits 502 and 522 can be used to couple touch electrodes 520 and 540 to touch circuitry (e.g., touch circuitry described above with reference to FIGS. 3A-3B). Conductive connections 504 and 524 can include a conductive material (e.g., copper, silver, gold, etc.) and can be used to connect the touch electrodes 520 and 540 to the flex circuits 502 and 522. In some examples, conductive connections 504 and 524 can be conductive traces of flex circuits 502 and 522.

In some examples, passivation layers 506 and 508 can include a transparent insulating material. For example, the passivation layers 506 and 508 can protect other components of the touch screen 500 from corrosion.

In some examples, cover material 514 can include a transparent material, such as glass or plastic or a material that is not transparent or a material that is semi transparent. Once an electronic device including touch screen 500 is fully assembled, the cover material 514 can be exposed to the environment of the electronic device, for example. In some examples, the user of the electronic device can touch the surface of the cover material 514 to interact with touch screen 500.

In some examples, some of the components of touch screen 500 can be joined together using adhesives. For example, the cover material 514 can be joined to the rest of touch screen 500 using adhesive 512. In some examples, adhesive 512 can be an optically clear adhesive. In some examples, adhesive 512 can be an electrical insulator. As another example, touch electrodes 520 and conductive connection 504 of the first flex circuit 502 can be joined by adhesive 516 that includes conductive particles 518. In some examples, adhesive 516 can be compressed so that the conductive particles 518 can form electrical connections between the touch electrodes 520 and the conductive connection 504 of the first flex circuit 502. Likewise, in some examples, touch electrodes 540 and conductive connection 524 of the second flex circuit 522 can be mechanically and electrically coupled by adhesive 524, which can include conductive particles 538.

In some examples, the thickness 551 of adhesive 512 can be at least the thickness of flex circuit 522 and conductive connection 524 in order to join passivation 508 and flex circuit 522 to the cover material 514. In some examples, the adhesive 512 can have thickness 551 at locations that do not include flex circuit 522 (e.g., at the location of flex circuit 502 illustrated in FIG. 5) in order to allow the cover material 514 to remain flat and smooth. If, instead of including flex circuit 522 between the substrate 510 and the cover material 514, the touch screen 500 included flex circuit 522 on the same side of substrate 510 as flex circuit 502, the thickness 551 of adhesive 512 and the overall thickness of touch screen 500 could be reduced. FIGS. 11-14E illustrate examples of touch screens in which both flex circuits are disposed on the same side (e.g., top side) of the substrate such that the substrate is between the flex circuits and the cover material. In some examples, the touch screens illustrated in FIGS. 11-14E can have a lower thickness than touch screen 500.

As described above, in some examples, touch screen 500 can include touch electrodes 520 and 540 on both sides (e.g., the top side and the bottom side) of substrate 510. For example, touch electrodes 540 (e.g., sense electrodes) can be disposed on a first side (e.g., bottom side) of the substrate so that the touch electrodes 540 are between the substrate 510 and the cover material 514 and touch electrodes 520 (e.g., drive electrodes) can be disposed on a second side (e.g., top side) of the substrate 510 opposite the first side of the substrate 510. Thus, in some examples, the substrate 510 can be between touch electrodes 520 (e.g., drive electrodes) and touch electrodes 540 (e.g., sense electrodes). In some examples, the substrate can include a dielectric material and disposing the drive electrodes and sense electrodes on opposite sides of substrate 510 can enable the drive electrodes and sense electrodes to be capacitively coupled without being directly electrically coupled.

In some examples, the flex circuits 502 and 522 of touch screen 500 can be disposed on opposite sides (e.g., top side and bottom side) of substrate 510 to connect to touch electrodes 520 (e.g., sense electrodes) and touch electrodes 540 (e.g., drive electrodes), respectively. In some examples, flex circuit 522 can fold around substrate 510 to connect to touch circuitry, while flex circuit 502 can fold without wrapping around substrate 510 (e.g., because flex circuit 522 folds towards substrate 510, whereas flex circuit 502 folds away from substrate 510). Flex circuit 522 can be disposed between the substrate 510 and the cover material 514, which can provide support to flex circuit 522 to allow flex circuit 522 to fold more tightly in the lateral direction than flex circuit 502, for example. In some examples, flex circuit 502 may not be mechanically supported on the side opposite from substrate 510, so flex circuit 502 may not bend as tightly as flex circuit 522 without damaging the bond between the touch electrodes and the flex circuit using adhesive 516. As shown in FIG. 5, in some examples, the fold of flex circuit 502 can be wider than the fold of flex circuit 522 by margin 550.

In some examples, if flex circuit 502 were disposed between substrate 510 and cover material 514 in the same manner as flex circuit 522, the width of the touch screen 500 needed to accommodate the flex circuit could be reduced by margin 550. In some examples, reducing the width of the touch screen 500 needed to accommodate the flex circuit in this way can reduce the width of a border region around touch screen 500 when the electronic device including the touch screen 500 is fully assembled. In some examples, the border region of the touch screen 500 can fully or partially surround an active area of the touch screen at which images can be displayed and touch can be sensed. In some examples, images may not be displayed and touch may not be sensed at locations of the border region. FIGS. 6-10C illustrate examples of touch screens that include both flex circuits between the substrate and cover material. In some examples, the touch screens illustrated in FIGS. 6-10C can have reduced widths needed to accommodate the bend of the flex circuit and/or reduced border regions compared to touch screen 500.

Figure 6:
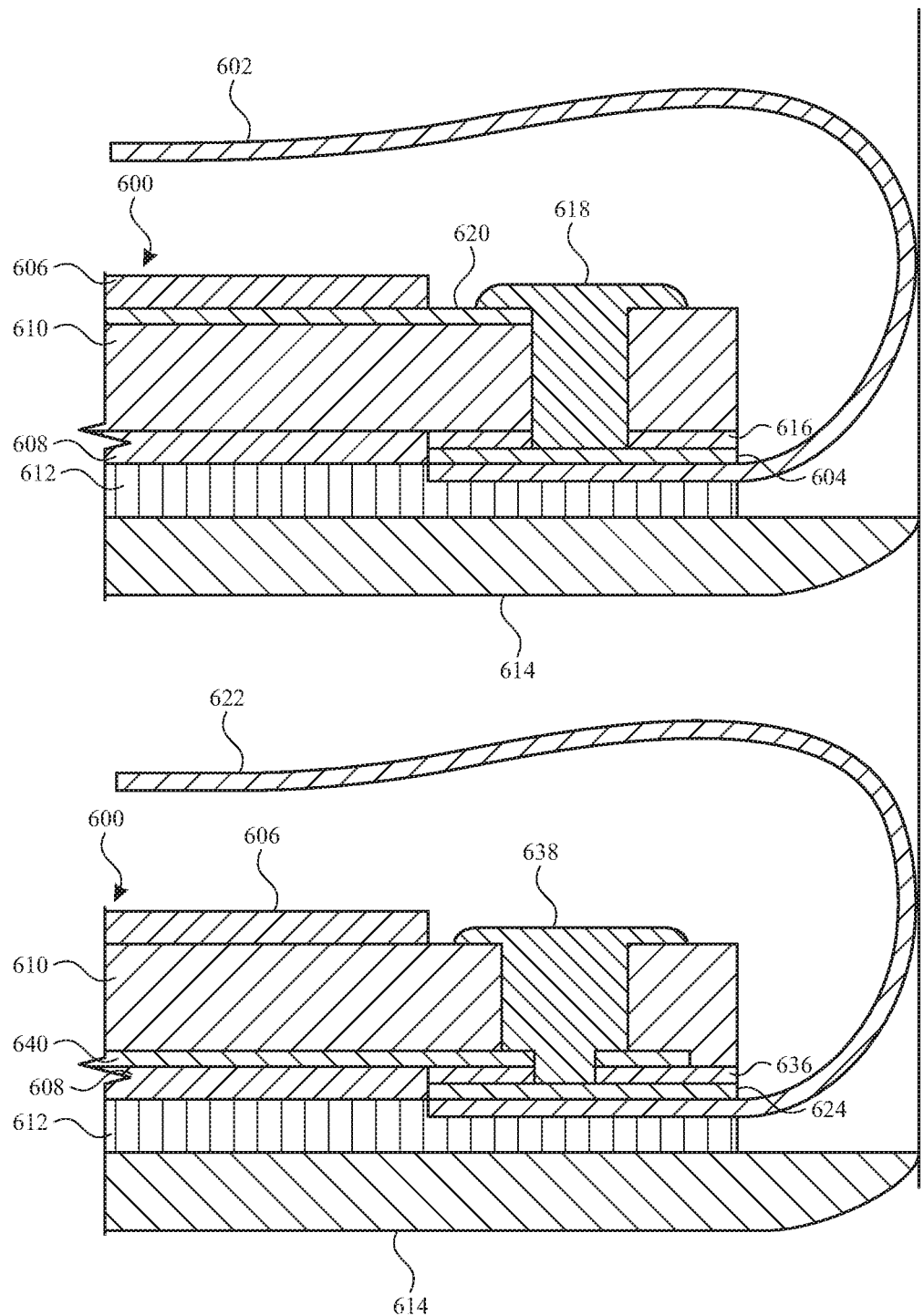
FIG. 6 illustrates cross-sections of an exemplary touch screen according to examples of the disclosure.

FIG. 6 illustrates cross-sections of an exemplary touch screen 600 according to examples of the disclosure. In some examples, the two cross-sections illustrated in FIG. 6 can be at different locations (e.g., the locations at which flex circuits 602 and 622 are bonded to touch screen 600) of the same touch screen 600. Touch screen 600 can include substrate 610, touch electrodes 620 (e.g., drive electrodes), touch electrodes 640 (e.g., sense electrodes), passivation layers 606 and 608, cover material 614, flex circuits 602 and 622, conductive connections 604 and 624, adhesives 616, 636, 612, and vias 618 and 638 for example. As will be described in more detail below, vias 618 and 638 can enable the connections to flex circuits 602 and 622 to both be on the same side (e.g., the bottom side) of the substrate 610 such that the connections to flex circuits 602 and 622 are between the substrate 610 and cover material 612.

Touch screen 600 can include a number of components included in touch screen 500 in some examples. For example, substrate 610, passivation layers 606 and 608, touch electrodes 620 and 640, cover material 614, conductive connections 604 and 624, and flex circuits 602 and 622 can be the same as or similar to substrate 510, passivation layers 506 and 508, touch electrodes 520 and 540, cover material 514, conductive connections 504 and 524, and flex circuits 502 and 522 described above with reference to FIG. 5, respectively, with the differences described below.

In some examples, touch screen 500 can include via 618 that can connect touch electrodes 620 (e.g., drive electrodes) to flex circuit 602 by way of conductive connection 604 and via 638 that connects touch electrodes 640 (e.g., sense electrodes) to flex circuit 622 by way of conductive connection 624. Conductive connections 604 and 624 can be coupled to substrate 610 by adhesives 616 and 636, for example. In some examples, adhesives 616 and 636 can be electrical insulators. In some examples, via 618 can be formed by filling holes in the substrate 610 and adhesive 616 with a conductive material, such as a conductive paste, wire, or ink that includes silver or another metal. Likewise, for example, via 638 can be formed by filling holes in substrate 610, touch electrodes 640, and adhesive 636 with the conductive paste, wire, or ink that includes silver or another metal. In some examples, the conductive material of vias 618 and 638 can directly contact touch electrodes 620 and 640 without adhesive being disposed between the vias 618 and 638 and the conductive connections 604 and 624 at the site of bonding. In some examples, as shown in FIG. 6, the hole through substrate 610 through which via 638 is formed can be wider than the holes through touch electrodes 640 and adhesive 636 to increase the contact area between touch electrodes 640 and the conductive filling of via 638. Increasing the contact area between touch electrodes 640 and via 638 can decrease the resistance of the connection of touch electronic device 640 to flex circuit 622. As will be described below with reference to FIGS. 7A-10C, the vias 618 and 638 can be formed by bonding the flex circuits 602 and 622 and conductive connections 604 and 624 to the touch screen 600 using adhesives 616 and 636, drilling holes through substrate 610 and adhesives 616 and 636, and then filling the vias 618 and 638 with a conductive material (e.g., a conductive paste, such as silver paste, copper paste, wires, conductive ink, etc.). In some examples, vias 618 and 638 can be in direct contact with the conductive connections 604 and 624 of flex circuits 602 and 622. For example, the adhesives 616 and 636 may not be disposed between the conductive material of vias 618 and 638 and the conductive connections 604 and 624 of flex circuits 602 and 622.

In some examples, vias 618 and 638 can enable both flex circuits 602 and 622 to be disposed on the same side (e.g., the bottom side) of the substrate 610 between the substrate 610 and cover material 614. Cover material 614 can be coupled to the rest of touch screen 600 by adhesive 612, for example. In some examples, cover material 614 and adhesive 612 can provide mechanical support to flex circuits 602 and 622 in a manner similar to the manner in which cover material 514 and adhesive 512 can provide mechanical support to flex circuit 522 in FIG. 5. Because both flex circuits 602 and 622 can be disposed between the substrate 610 and cover material 614, both flex circuits 602 and 622 can bend in similar manners as flex circuit 522 (and each other) with similar bend widths as flex circuit 522 and each other, for example. Thus, in some examples, the width of touch screen 600 can be less than the width of touch screen 500 and/or the width of a border region of touch screen 600 can be less than the width of a border region of touch screen 500. In some examples, connecting touch electrodes 620 and 640 to flex circuits 602 and 622 on the same side (e.g., the bottom side or top side) of substrate 610 can enable the use of a single bond pad for connections to electrodes 620 and 640.

In some examples, touch screen 600 can have increased durability, reliability, and/or manufacturing yield compared to touch screen 500. For example, the compression that may be needed to connect conductive connections 504 and 524 to the touch electrodes 520 and 540 using the metal particles 518 and 538 embedded in adhesives 516 and 536 can cause damage to the flex circuits 502 and 522 and/or conductive connections 504 and 524. In some examples, this compression can cause cracks in conductive connections 504 and 524 and/or in flex circuits 502 and 522 that reduce durability and/or reliability or reduce manufacturing yield. In some examples, the adhesives 616 and 636 that couple conductive connections 604 and 624 to substrate 610 in touch screen 600 may not include conductive particles because the connection from the touch electrodes 620 and 640 to the conductive connections 604 and 624 is made by vias 618 and 638. Thus, for example, touch screen 600 may not be compressed to the same degree that touch screen 500 can be compressed during fabrication, which can reduce or prevent damage to flex circuits 602 and 622 and/or conductive connections 604 and 624.

FIGS. 7A-7D illustrate fabrication of exemplary touch screen 600 according to some examples of the disclosure. In some examples, FIGS. 7A-7D can be cross-sections of touch screen 600 during fabrication. For example, via 618 can be formed according to the examples in FIGS. 7A-7D. As described above with reference to FIG. 6, in some examples, via 618 can be used to couple flex circuit 602 to the touch electrodes 620 through passivation layer 608 and adhesive 616.

Figure 7A:
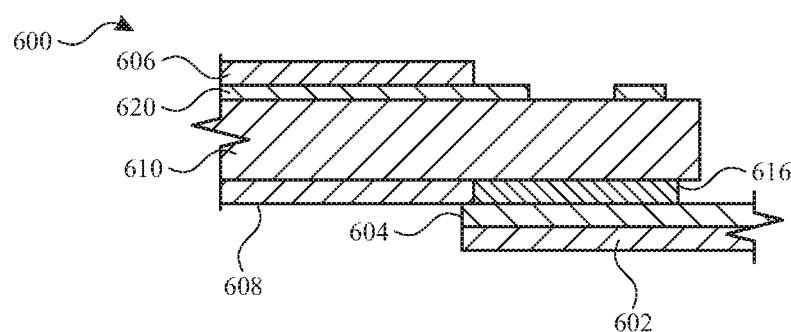
FIGS. 7A-7D illustrate fabrication of exemplary touch screen according to some examples of the disclosure.

In FIG. 7A, touch screen 600 can include substrate 610, touch electrodes 620 (e.g., drive electrodes), passivation 606 and 608, adhesive 616, conductive connection 604, and flex circuit 602, for example. In some examples, conductive connection 604 and flex circuit 602 are coupled to substrate 610 by adhesive 616 using low pressure bonding (e.g., NCF bonding), for example. In some examples, touch electrodes 620 can be patterned, including patterns that form individual touch electrodes, such as in one of the patterns illustrated in FIG. 4A-4B, patterns including holes though which vias can be formed (e.g., including a hole through which via 618 can be formed), and patterns that couple the individual touch electrodes to the locations of the vias. In FIG. 7A, for example, holes are not yet formed through substrate 610 or adhesive 616.

In some examples, in FIG. 7B, the touch screen 600 can include the same components as the components described with reference to FIG. 7A, except for the differences which will now be described. For example, in FIG. 7B, substrate 610 and adhesive 616 can include holes that overlap the holes in touch electrodes 620. In some examples, touch electrodes 620 can include a plurality of electrodes in the active area of the touch screen 600 at which touch can be sensed and images can be displayed and each electrode can include a hole through which a via 618 can be formed to connect the touch electrode to the flex circuit 602 by way of conductive connection 604. The cross-section illustrated in FIG. 7B, for example, can include a portion of a respective electrode of the touch electrodes 620 at which the respective electrode can be coupled to flex circuit 602. In some examples, the holes through substrate 610 and adhesive 616 can be formed using selective drilling with a laser (e.g., a $CO_2$ laser) or other suitable through hole techniques, which will be described in more detail below with reference to FIGS. 17-18. In short, in some examples, the laser can form holes through the material of substrate 610 and adhesive 616 but may not form holes through conductive and/or metallic material, such as the material of conductive connection 604 (e.g., copper, silver, gold, etc.) of flex circuit 602. In some examples, selective drilling of the substrate 610 and adhesive 616 while the conductive connection 604 and flex circuit 602 are coupled to substrate 610 by adhesive 616 (e.g., subsequent to bonding the flex circuit) can improve or ensure alignment of the holes of touch electrodes 620, substrate 610, and adhesive 616.

Figure 7B:
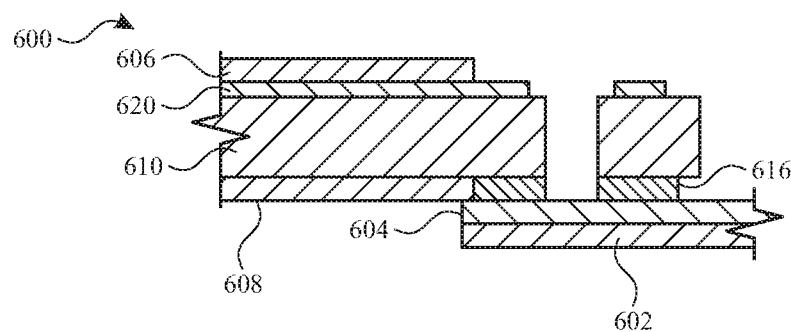
Figure 7C:
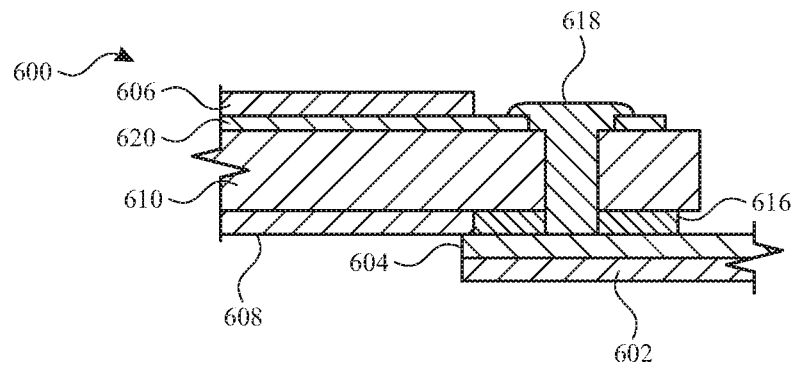

In some examples, in FIG. 7C, the touch screen 600 can include the conductive material (e.g., conductive paste, conductive ink, wires, etc.) of via 618 in addition to the components described above with reference to FIGS. 7A-7B. The conductive material of via 618 can be deposited in the hole through touch electrodes 620, substrate 610, and adhesive 616, for example. In some examples, the conductive material of via 618 can electrically couple the touch electrodes 620 to flex circuit 602 by way of conductive connection 604.

Figure 7D:
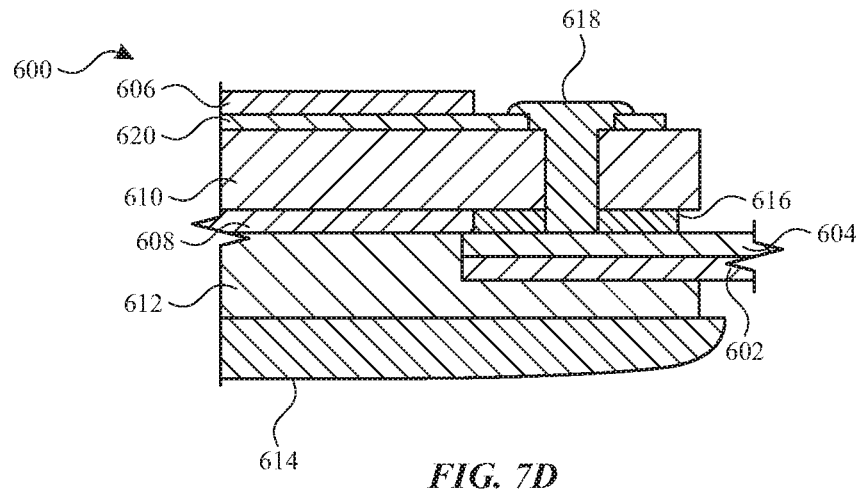

In some examples, in FIG. 7D, the touch screen 600 can include cover material 614 and adhesive 612 in addition to the components described above with reference to FIGS. 7A-7C. In some examples, adhesive 612 can couple cover material 614 to passivation 608 and flex circuit 602.

FIGS. 8A-8D illustrate fabrication of exemplary touch screen 600 according to some examples of the disclosure. In some examples, FIGS. 8A-8D can be cross-sections of touch screen 600 during fabrication. For example, via 638 can be formed according to the examples in FIGS. 8A-8D. As described above with reference to FIG. 6, in some examples, via 638 can be used to couple flex circuit 622 to the touch electrodes 640 through adhesive 636.

Figure 8A:
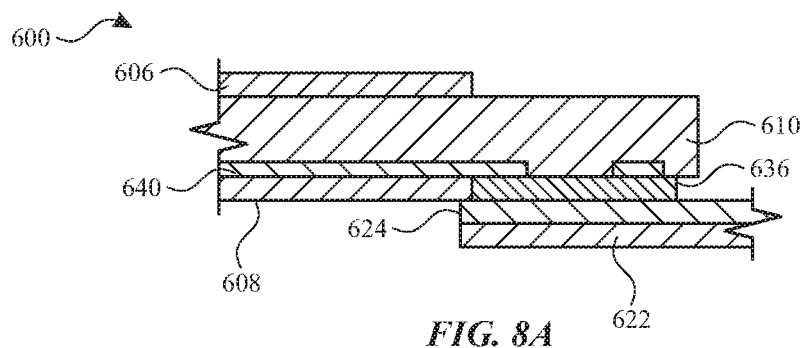
FIGS. 8A-8D illustrate fabrication of exemplary touch screen according to some examples of the disclosure.

In FIG. 8A, touch screen 600 can include substrate 610, touch electrodes 640 (e.g., drive electrodes), passivation 606 and 608, adhesive 636, conductive connection 624, and flex circuit 622, for example. In some examples, conductive connection 624 and flex circuit 622 are coupled to substrate 610 by adhesive 636 using low pressure bonding (e.g., NCF bonding), for example. In some examples, touch electrodes 640 can be patterned, including patterns that form individual touch electrodes, such as in one of the patterns illustrated in FIG. 4A-4B, patterns including holes though which vias can be formed (e.g., including a hole through which via 638 can be formed), and patterns that couple the individual touch electrodes to the locations of the vias. In FIG. 8A, for example, holes are not yet formed through substrate 610 or adhesive 636.

In some examples, in FIG. 8B, the touch screen 600 can include the same components as the components described with reference to FIG. 8A, except for the differences which will now be described. For example, in FIG. 8B, substrate 610 and adhesive 636 can include holes that overlap the holes in touch electrodes 640. In some examples, touch electrodes 640 can include a plurality of electrodes in the active area of the touch screen 600 at which touch can be sensed and images can be displayed and each electrode can include a hole through which a via 638 can be formed to connect the touch electrode to the flex circuit 622 by way of conductive connection 624. The cross-section illustrated in FIG. 8B, for example, can include a portion of a respective electrode of the touch electrodes 640 at which the respective electrode can be coupled to flex circuit 622.

In some examples, the holes through substrate 610 and adhesive 636 can be formed using selective drilling with a laser (e.g., a $CO_2$ laser) or other suitable through hole techniques, which will be described in more detail below with reference to FIGS. 17-18. In short, in some examples, the laser can form holes through the material of substrate 610 and adhesive 636 but may not form holes through conductive and/or metallic material, such as the material of conductive connection 604 (e.g., copper, silver, gold, etc.) of flex circuit 622 and touch electrodes 640.

Figure 8B:
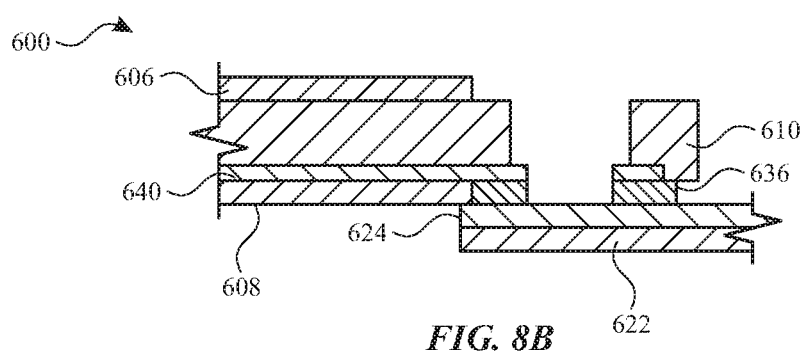

As shown in FIG. 8B, in some examples, the hole through substrate 610 can be wider than the holes through the touch electrodes 640 and adhesive 636 because the laser beam can be wider than the hole through touch electrodes 640. As described above, in some examples, it can be advantageous for the hole through substrate 610 to be wider than the holes through touch electronic device 640 and adhesive 636 because it can improve the connection of the via and the touch electrodes 640. In some examples, the touch electrodes 640 can act as a mask because the laser may form a hole through portions of the adhesive 636 exposed through the hole in the touch electrodes 640 but may not form a hole through the touch electrodes 640. In some examples, selective drilling of the substrate 610 and adhesive 636 while the conductive connection 624 and flex circuit 622 are coupled to substrate 610 by adhesive 636 (e.g., subsequent to bonding the flex circuit 622) can improve or ensure alignment of the holes of touch electrodes 640, substrate 610, and adhesive 636.

Figure 8C:
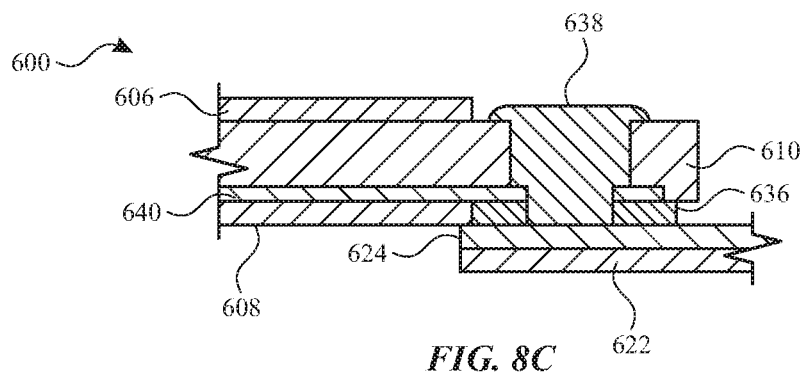

In some examples, in FIG. 8C, the touch screen 600 can include the conductive material (e.g., conductive paste, conductive ink, wires, etc.) of via 638 in addition to the components described above with reference to FIGS. 8A-8B. The conductive material of via 638 can be deposited in the hole through touch electrodes 640, substrate 610, and adhesive 636, for example. In some examples, the conductive material of via 638 can electrically couple the touch electrodes 640 to flex circuit 622 by way of conductive connection 624.

Figure 8D:
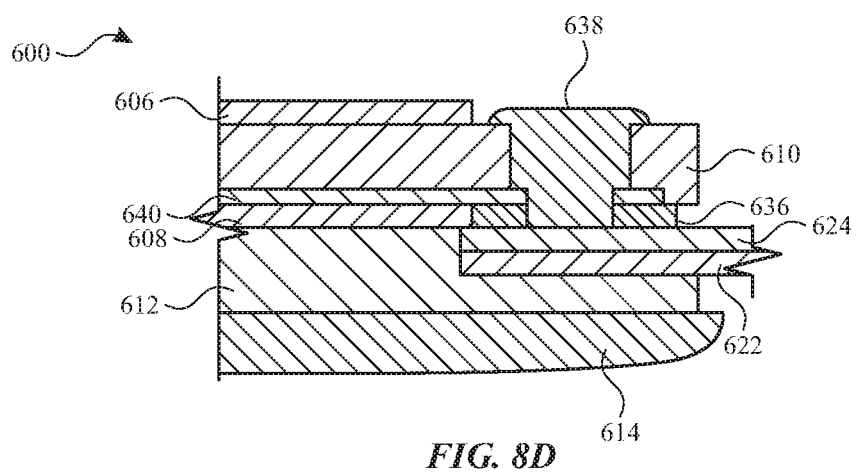

In some examples, in FIG. 8D, the touch screen 600 can include cover material 614 and adhesive 612 in addition to the components described above with reference to FIGS. 8A-8C. In some examples, adhesive 612 can couple cover material 614 to passivation 608 and flex circuit 622.

It should be understood that, in some examples, the one or more operations described with reference to FIGS. 7A-7D and the one or more operations described with reference to FIGS. 8A-8D can be performed with respect to a single touch screen 600. In some examples, the touch screen 600 can include a plurality of touch electrodes 620 and a plurality of touch electrodes 640 and each touch electrode can be coupled to flex circuits 602 and 622 (by way of conductive connections 604 and 624) using vias 618 and 638. Thus, in some examples, the operations described above with reference to FIGS. 7A-8D can be repeated or performed multiple times concurrently to couple all touch electrodes 620 and 640 to the flex circuits 602 and 622 with vias 618 and 638. In some examples, the operations described with reference to FIGS. 7A-7D can be performed in series with, concurrently with, or in an alternating manner with the operations described with reference to FIGS. 8A-8D. Thus, in some examples, the operations described with reference to FIGS. 7A-8D can be used to fabricate a touch screen 600 that includes touch electrodes 620 and 640, conductive connections 604 and 624, and flex circuits 602 and 622. Modifications to the operations described with reference to FIGS. 7A-8D can be made without departing from the scope of the disclosure in some examples. For example, modifications to the operations illustrated in FIGS. 7A-7B are described below with reference to FIGS. 9A-9C and modifications to the operations illustrated in FIGS. 8A-8B are described below with reference to FIGS. 10A-10C.

Figure 9A:
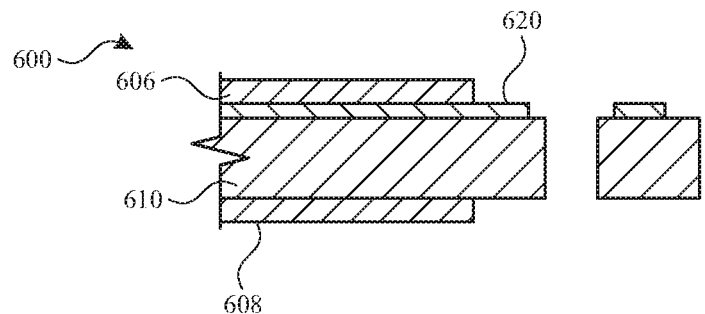
FIGS. 9A-9C illustrate fabrication of exemplary touch screen according to some examples of the disclosure.
Figure 9B:
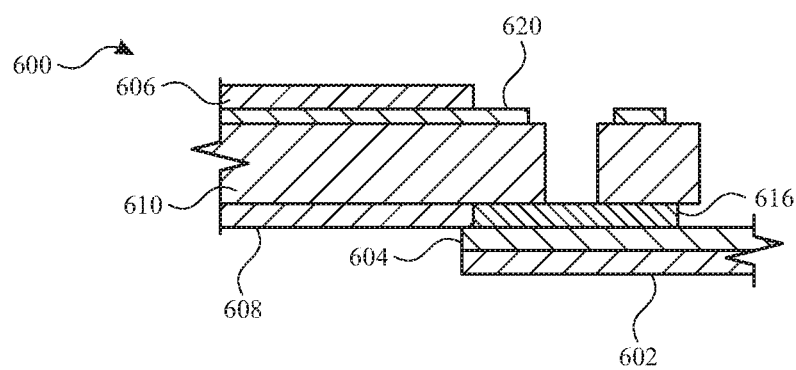
Figure 9C:
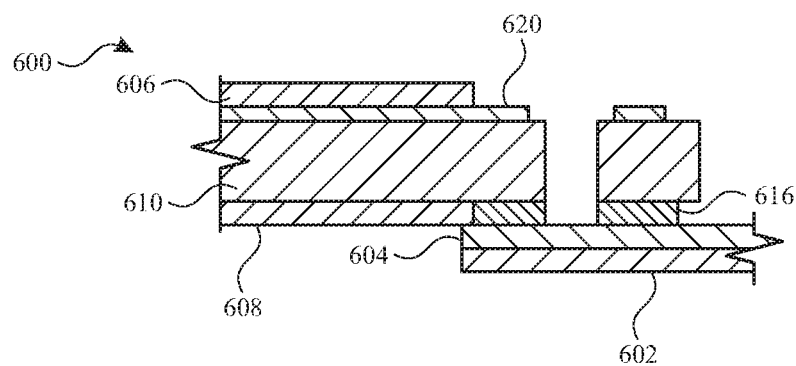

FIGS. 9A-9C illustrate fabrication of exemplary touch screen 600 according to some examples of the disclosure. In some examples, FIGS. 9A-9C can be cross-sections of touch screen 600 during fabrication. In some examples, one or more operations described below with reference to FIGS. 9A-9C can replace one or more of the operations described above with reference to FIGS. 7A-7B when fabricating touch screen 600. Thus, in some examples, via 618 can be formed according to FIGS. 9A-9C and 7C-7D. As described above with reference to FIGS. 6-7D, in some examples, via 618 can be used to couple flex circuit 602 to the touch electrodes 620 through passivation layer 608 and adhesive 616.

In some examples, such as in FIG. 9A, touch screen 600 can include substrate 610, touch electrodes 620 (e.g., drive electrodes), and passivation 606 and 608. In some examples, touch electrodes 620 and substrate 610 can include holes that are at least partially aligned with one another. Thus, although portions of the substrate 610 and touch electrodes 620 may appear disconnected in FIG. 9A, it should be understood that FIG. 9A can be a cross-section of the touch screen 600 at a location of holes through touch electrodes 620 and substrate 610. In some examples, the portions of the substrate 610 illustrated in FIG. 9A can be coupled at another location of the touch screen 600 (not shown) at which the hole in substrate 610 is not disposed. Likewise, in some examples, the portions of the touch electrode 620 illustrated in FIG. 9A can be coupled at another location of the touch screen 600 (not shown) at which the holes through the touch electrodes 620 are not disposed. In some examples, touch electrodes 620 can be patterned to include individual touch electrodes (e.g., in one of the patterns illustrated in FIGS. 4A-4B), patterns including holes though which vias can be formed (e.g., including a hole through which via 618 can be formed), and patterns that couple the individual touch electrodes to the locations of the vias. Thus, in FIG. 9A, the hole through substrate 610 can be made before coupling flex circuit 602 and conductive connection 604 to the touch screen 600, unlike in FIGS. 7A-7B in which substrate 610, conductive connection 604, flex circuit 602, and adhesive 616 are coupled (e.g., bonded using adhesive) before holes are formed through substrate 610 and adhesive 616.

In FIG. 9B, in some examples, touch screen 600 can include adhesive 616, conductive connection 604, and flex circuit 602 in addition to the components described above with reference to FIG. 9A. The conductive connection 604 can be coupled to substrate 610 by adhesive 616 using low pressure bonding (e.g., NCF bonding or other bonding technique(s)).

In some examples, in FIG. 9C, the touch screen 600 can include the same components as the components described in FIG. 9B, except for the differences described herein. For example, a hole can be formed through adhesive 616. In some examples, the hole through adhesive 616 can be formed using selective laser drilling or other through hole technique(s). As described above with reference to FIGS. 7A-8D and as will be described in more detail below with reference to FIGS. 17-18, selective laser drilling can be used to form holes through some materials (e.g., plastics such as substrate 610 and adhesive 616) without forming holes through other materials (e.g., conductive materials and/or metals such as conductive connection 604). In some examples, forming the hole though adhesive 616 while adhesive 616 and conductive connection 604 are coupled to passivation layer 608 can improve and/or ensure alignment between the holes through passivation layer 608, touch electrodes 620, and adhesive 616.

It should be appreciated that touch screen 600 illustrated in FIG. 9C can be the same as or similar to touch screen 600 illustrated in FIG. 7B, for example. Thus, in some examples, after performing the operations described above with reference to FIGS. 9A-9C, the via 618 can be filled with conductive material and the cover material 614 can be applied with an adhesive 612, as described above with reference to FIGS. 7C-7D, to continue fabrication of touch screen 600. It should be understood that, in some examples, the order in which the operations are performed can change and modifications to the operations can be made without departing from the scope of the disclosure.

Figure 10A:
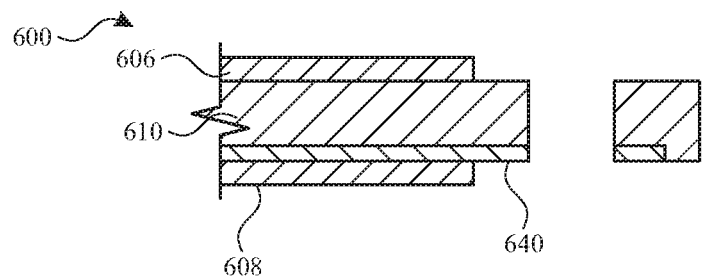
FIGS. 10A-10C illustrate fabrication of exemplary touch screen according to some examples of the disclosure.
Figure 10B:
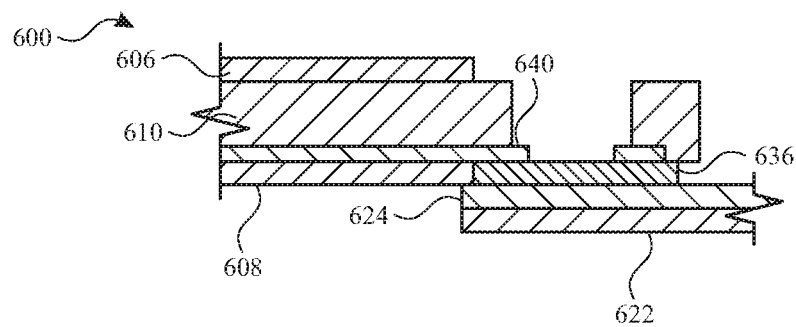
Figure 10C:
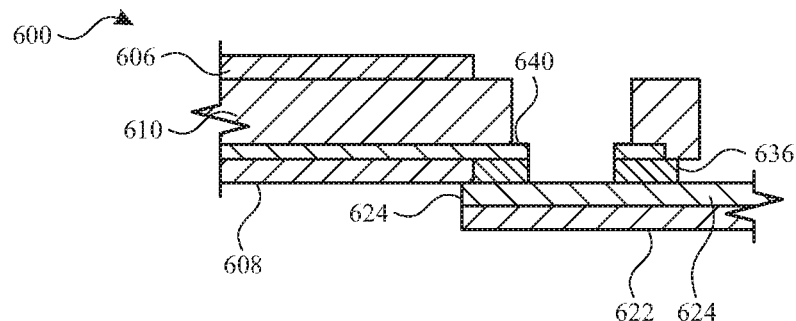

FIGS. 10A-10C illustrate fabrication of exemplary touch screen 600 according to some examples of the disclosure. In some examples, FIGS. 10A-10C can be cross-sections of touch screen 600 during fabrication. In some examples, one or more operations described below with reference to FIGS. 10A-10C can replace one or more of the operations described above with reference to FIGS. 8A-8B when fabricating touch screen 600. Thus, in some examples, via 638 can be formed according to FIGS. 10A-10C and 8C-8D. As described above with reference to FIGS. 6 and 8A-8D, in some examples, via 638 can be used to couple flex circuit 622 to touch electrodes 640 through adhesive 636.

In some examples, such as in FIG. 10A, touch screen 600 can include substrate 610, touch electrodes 640 (e.g., sense electrodes), and passivation 606 and 608. In some examples, touch electrodes 640 and substrate 610 can include holes that are at least partially aligned with one another. Thus, although portions of the substrate 610 and touch electrodes 640 may appear disconnected in FIG. 10A, it should be understood that FIG. 10A can be a cross-section of the touch screen 600 at a location of holes through touch electrodes 640 and substrate 610. In some examples, the portions of the substrate 610 illustrated in FIG. 10A can be coupled at another location of the touch screen 600 (not shown) at which the hole in substrate 610 is not disposed. Likewise, in some examples, the portions of the touch electrode 640 illustrated in FIG. 10A can be coupled at another location of the touch screen 600 (not shown) at which the holes through the touch electrodes 640 are not disposed. In some examples, touch electrodes 640 can be patterned to include individual touch electrodes (e.g., in one of the patterns illustrated in FIGS. 4A-4B), patterns including holes though which vias can be formed (e.g., including a hole through which via 638 can be formed), and patterns that couple the individual touch electrodes to the locations of the vias. Thus, in FIG. 10A, the hole through substrate 610 can be made before coupling flex circuit 622 and conductive connection 624 to the touch screen 600, unlike in FIGS. 8A-8B in which the substrate 610, flex circuit 624, conductive connection 624, and adhesive 636 can be coupled together (e.g., bonded using adhesive) before holes are formed through substrate 610 and adhesive 636.

In FIG. 10B, in some examples, touch screen 600 can include adhesive 636, conductive connection 624, and flex circuit 622 in addition to the components described above with reference to FIG. 10A. The conductive connection 624 can be coupled to substrate 610 by adhesive 636 using low pressure bonding (e.g., NCF bonding) or other bonding technique(s).

In some examples, in FIG. 10C, the touch screen 600 can include the same components as the components described in FIG. 10B, except for the differences described herein. For example, a hole can be formed through adhesive 636. In some examples, the hole through adhesive 636 can be formed using selective laser drilling or other through hole technique(s). As described above with reference to FIGS. 7A-9C and as will be described in more detail below with reference to FIGS. 17-18, selective laser drilling can be used to form holes through some materials (e.g., plastics such as substrate 610 and adhesive 636) without forming holes through other materials (e.g., conductive materials and/or metals such as conductive connection 624). In some examples, forming the hole though adhesive 636 while adhesive 636 and conductive connection 624 are coupled to passivation layer 608 can improve and/or ensure alignment between the holes through passivation layer 608, touch electrodes 640, and adhesive 636.

It should be appreciated that touch screen 600 illustrated in FIG. 10C can be the same as or similar to touch screen 600 illustrated in FIG. 8B, for example. Thus, in some examples, after performing the operations described above with reference to FIGS. 10A-10C, the via 638 can be filled with conductive material and the cover material 634 can be applied with an adhesive 612, as described above with reference to FIGS. 8C-8D, to continue fabrication of touch screen 600. It should be understood that, in some examples, the order in which the operations are performed can change and modifications to the operations can be made without departing from the scope of the disclosure.

It should be understood that, in some examples, one or more operations described with reference to one or more of FIGS. 7A-10C can be performed with respect to a single touch screen 600. In some examples, the touch screen 600 can include a plurality of touch electrodes 620 and a plurality of touch electrodes 640 and each touch electrode can be coupled to flex circuits 602 and 622 (by way of conductive connections 604 and 624) using vias 618 and 638. Thus, in some examples, the operations described above with reference to FIGS. 7A-10C can be repeated or performed multiple times concurrently to couple all touch electrodes 620 and 640 to the flex circuits 602 and 622 with vias 618 and 638. In some examples, the operations described with reference to FIGS. 7A-7D and/or 9A-9C can be performed in series with, concurrently with, or in an alternating manner with the operations described with reference to FIGS. 8A-8D and/or 10A-10C. Thus, in some examples, the operations described with reference to one or more of FIGS. 7A-10C can be used to fabricate a touch screen 600 that includes touch electrodes 620 and 640, conductive connections 604 and 624, and flex circuits 602 and 622. Modifications to the operations described with reference to FIGS. 7A-10C can be made without departing from the scope of the disclosure in some examples.

Figure 11:
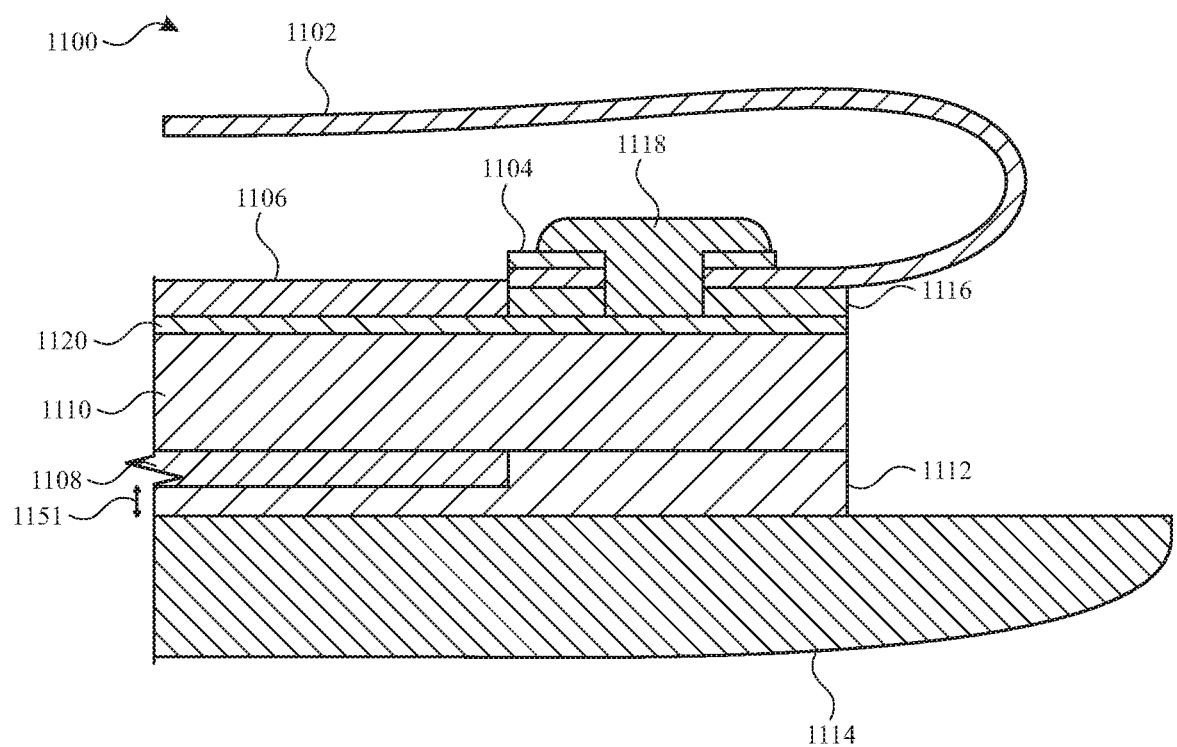
FIG. 11 illustrates a cross section of an exemplary touch screen according to some examples.

FIG. 11 illustrates a cross section of an exemplary touch screen 1100 according to some examples. Touch screen 1100 can include substrate 1110, touch electrodes 1120 (e.g., drive electrodes), passivation layers 1106 and 1108, cover material 1114, flex circuit 1102, conductive connection 1104, adhesives 1116, 1112, and via 1118 for example. In some examples, touch screen 1100 can have the cross section illustrated in FIG. 11 and, at other location(s) of the touch screen 1100, one or more of the cross sections illustrated in FIGS. 12A-C. Thus, in some examples, touch screen 1100 can further include flex circuit 1124, touch electrodes 1140 (e.g., sense electrodes), conductive connection 1124 or conductive connections 1124a and 1124b, and via 1138 illustrated in FIGS. 12A-12C. As will be described in more detail below, as shown in FIGS. 11-12C, in some examples, vias 1118 and 1138 can enable the connections to flex circuits 1102 and 1122 to both be on the same side of substrate 1110 such that the substrate 1110 is between the flex circuits 1102 and 1122 and cover material 1114.

Referring to FIG. 11, in some examples, touch screen 1100 can include a number of components included in touch screens 500 and 600. For example, substrate 1110, passivation layers 1106 and 1108, touch electrodes 1120, cover material 1114, conductive connection 1104, and flex circuit 1102 can be the same as or similar to substrate 510 and/or 610, passivation layers 506, 508, 606 and 608, touch electrodes 520 and/or 620, cover material 514 and/or 614, conductive connections 504 and/or 604, and flex circuits 502 and/or 602 described above with reference to FIGS. 5-10C, respectively, with the differences described below.

In some examples, via 1118 can electrically couple touch electrodes 1120 (e.g., drive electrodes) to flex circuit 1102 by way of conductive connection 1104. Flex circuit 1102 can be bonded to touch electrodes 1120 by adhesive 1116 (e.g., using low pressure bonding, such as NCF bonding, or other suitable technique(s)), for example. In some examples, flex circuit 1102 can be disposed between conductive connection 1104 and adhesive 1116, as shown in FIG. 11. In some examples, conductive connection 1104 can be coupled to touch electrodes 1120 by adhesive 1116 and conductive connection 1104 can be disposed between flex circuit 1102 and adhesive 1116. Via 1118 can be filled with a conductive material (e.g., conductive paste such as silver paste or copper paste, conductive ink, wire), for example. In some examples, via 1118 can be in direct contact with the conductive connection 1104 of flex circuit 1102. For example, adhesive 1116 may not be disposed between the conductive material of via 1118 and the conductive connection 1104 of flex circuit 1102 at the site at which the conductive connection 1102 is bonded to touch screen 1100.

Figure 12A:
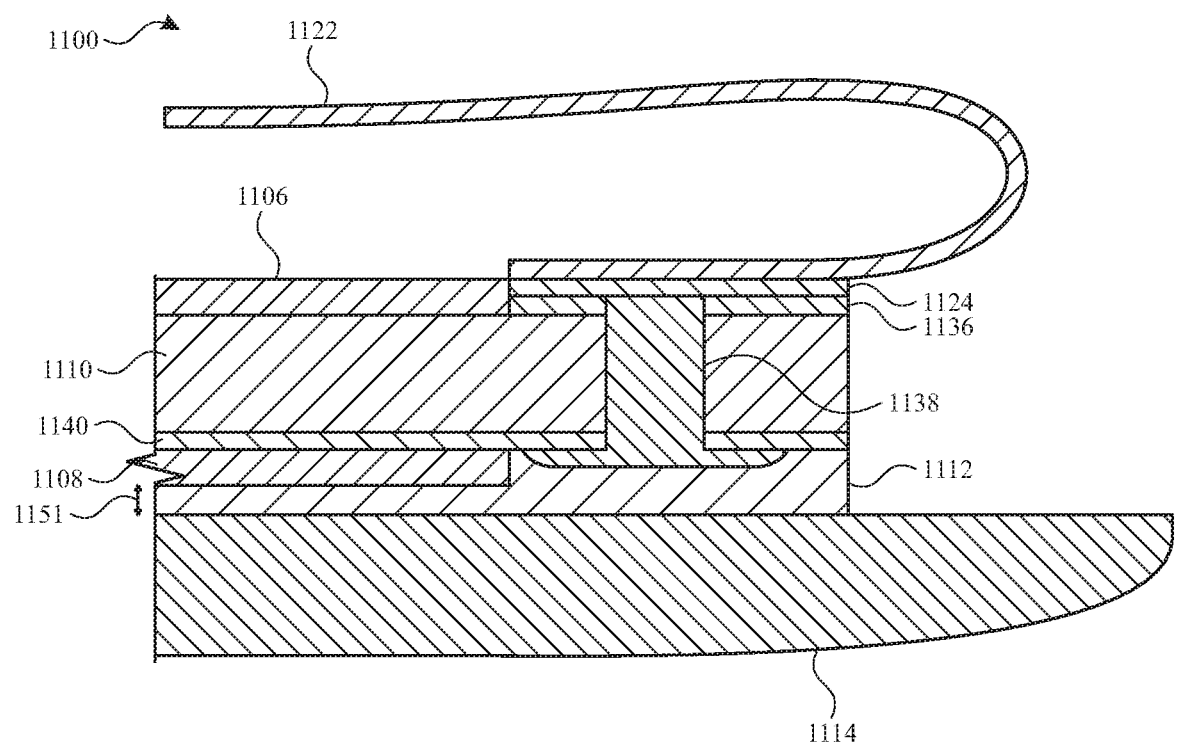
FIGS. 12A-12C illustrate cross sections of an exemplary touch screen according to some examples of the disclosure.
Figure 12B:
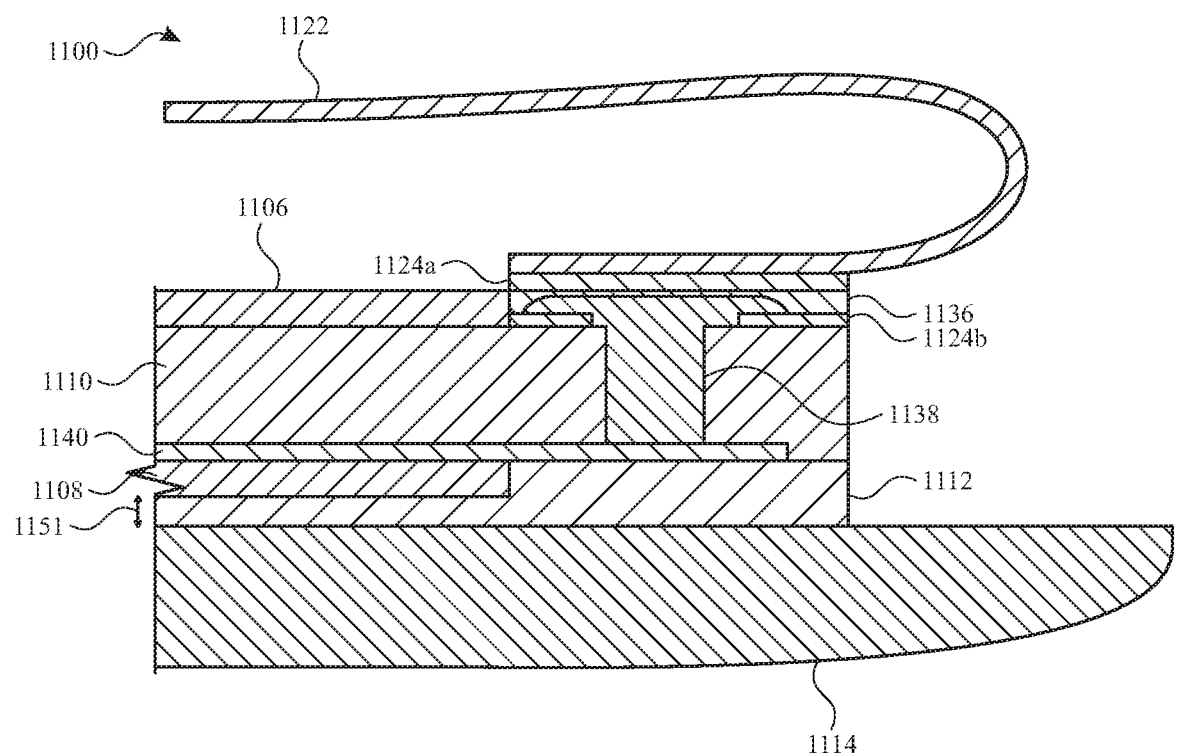
Figure 12C:
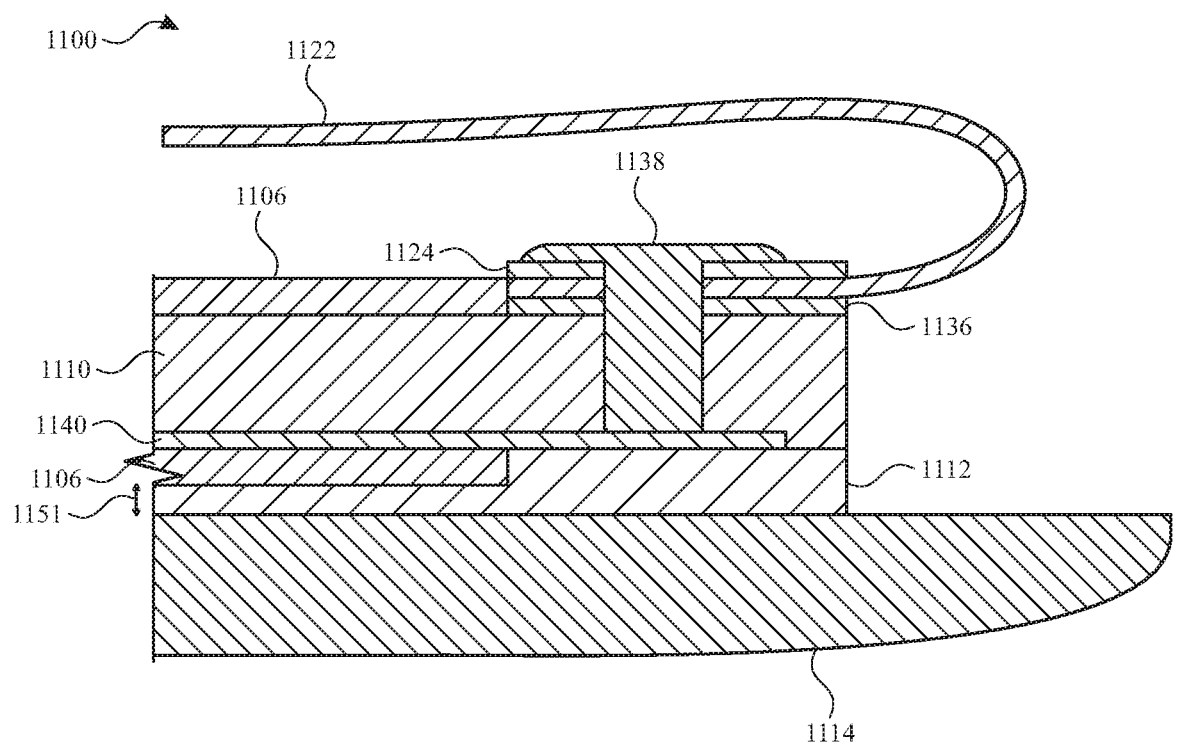

FIGS. 12A-12C illustrate cross sections of an exemplary touch screen 1100 according to some examples of the disclosure. In some examples, touch screen 1100 can include one or more of the cross sections illustrated in FIGS. 12A-12C and the cross-section illustrated in FIG. 11. In addition to the components illustrated in FIG. 11, in some examples, the touch screen 1100 can further include flex circuit 1122, via 1138, and conductive connection(s) 1124 or 1124a and 1124b. In some examples, touch screen 1100 includes components the same as or similar to components included in touch screens 500 and 600. For example, flex circuit 1122 and conductive connections 1124, 1124a, and 1124b, can be the same as or similar to flex circuits 522 and 622 and conductive connections 524 and 624, respectively, described above with reference to FIGS. 5-10C, with the differences described below.

In some examples, via 1138 can electrically couple touch electrodes 1140 (e.g., sense electrodes) to flex circuit 1122. Via 1138 can be filled with a conductive material (e.g., conductive paste, such as silver paste or copper paste, conductive ink, wire, etc.), for example. In some examples, via 1138 can be in direct contact with the conductive connection 1124 of flex circuit 1122. For example, adhesive 1136 may not be disposed between the conductive material of via 1138 and the conductive connection 1124 of flex circuit 1122 at the site at which the flex circuit 1122 is bonded to the touch screen 1100. Several alternative structures for via 1138 can be possible, as shown in FIGS. 12A-12C, for example.

In FIG. 12A, for example, conductive connection 1124 can be disposed between flex circuit 1122 and substrate 1110. In some examples, conductive connection 1124 can be bonded to substrate 1110 by adhesive 1136 via low pressure bonding (e.g., NCF bonding) or other suitable technique(s). Via 1138 can include holes through substrate 1110 and adhesive 1136 to electrically couple touch electrodes 1140 to flex circuit 1122 by way of conductive connection 1124. In some examples, via 1138 illustrated in FIG. 12A can be formed by patterning the touch electrodes 1140 to include a hole at the location of via 1138, drilling holes through substrate 1110 and adhesive 1136, and filling the via 1138 with conductive material from the side of touch screen 1100 including touch electrodes 1140, as will be described below with reference to FIGS. 14A-14E. As shown in FIG. 12A, touch screen 1100 can further include cover material 1114 coupled to the rest of touch screen 1100 by adhesive 1112, for example. In some examples, the cover material 1114 is disposed such that the substrate 1110 is between flex circuit 1122 and cover material 1114.

In some examples, such as in FIG. 12B, touch screen 1100 can include two conductive connections 1124a and 1124b to flex circuit 1122. For example, conductive connection 1124b can be coupled to substrate 1110 and the conductive material of via 1138. In some examples, conductive connection 1124a can be disposed between flex circuit 1122 and via 1138 and can be coupled to the rest of touch screen 1100 by adhesive 1137. In some examples, adhesive 1137 can be ACF or another conductive adhesive. In some examples, via 1138 can be formed by patterning or drilling a hole in conductive connection 1124b, drilling a hole through substrate 1110, and filling the holes with a conductive material. After via 1138 is formed, in some examples, conductive connection 1124a and flex circuit 1122 can be coupled to touch screen 1100 by adhesive 1137. As shown in FIG. 12B, touch screen 1100 can further include cover material 1114 coupled to the rest of touch screen 1100 by adhesive 1112, for example. In some examples, the cover material 1114 is disposed such that the substrate 1110 is between flex circuit 1122 and cover material 1114.

In some examples, such as in FIG. 12C, a portion of flex circuit 1122 can be disposed between conductive connection 1124 and adhesive 1136. For example, flex circuit 1122 can be coupled to substrate 1110 by adhesive 1136. In some examples, via 1138 can be formed through holes through conductive connection 1124, flex circuit 1122, adhesive 1136, and substrate 1110. In some examples, flex circuit 1122 can be pre-fabricated with a hole to accommodate via 1138. In some examples, the hole through flex circuit 1122 can be formed using laser drilling (e.g., using a UV laser or a CO$_2$ laser) prior to bonding the flex circuit 1122 to the rest of touch screen 1100. In some examples, the hole through conductive connection 1124 can be formed using a photolithography process. In some examples, the hole through flex circuit 1122 can be formed while the flex circuit 1122 is coupled to the rest of touch screen 1100 illustrated in FIG. 12C using selective drilling with a laser (e.g., a CO$_2$ laser). In some examples, the selective laser drilling process can use the hole formed through conductive connection as a mask because, for example, the laser may not form holes through conductive materials such as the material of conductive connection 1124 or touch electrodes 1140. For example, the laser can form holes through flex circuit 1122, adhesive 1136, and substrate 1110 with the same or a similar diameter and placement as the hole through conductive connection 1124. In some embodiments, the selective drilling process does not form a hole through the touch electrodes 1140. For example, once the holes of via 1138 are formed, the via 1138 can be filled with conductive material (e.g., conductive paste such as silver paste or copper paste) to electrically couple flex circuit 1122 to touch electrodes 1140 by way of conductive connection 1124. As shown in FIG. 12C, touch screen 1100 can further include cover material 1114 coupled to the rest of touch screen 1100 by adhesive 1112, for example. In some examples, the cover material 1114 is disposed such that the substrate 1110 is between flex circuit 1122 and cover material 1114.

Thus, in some examples, as described above with reference to FIGS. 11-12C, flex circuits 1102 and 1122 can be coupled to touch screen 1100 on the same side of substrate 1110 such that substrate 1110 is between the flex circuits 1102 and 1122 and cover material 1114. In some examples, because the flex circuits 1102 and 1122 are not between the substrate 1110 and cover material 1114, the thickness 1151 of adhesive 1112 can be less than the thickness 551 of adhesive 512 illustrated in FIG. 5. Thus, in some examples, touch screen 1100 can be thinner than touch screen 500. Moreover, in some examples, because the connections to the flex circuits 1102 and 1122 can be made on the same side of substrate 1110 of touch screen 1100, a single bond pad may be used for the connections to the flex circuits 1102 and 1122.

In some examples, touch screen 1100 can have increased durability, reliability, and/or manufacturing yield compared to touch screen 500. For example, the compression that may be needed to connect conductive connections 504 and 524 to the touch electrodes 520 and 540 using the metal particles 518 and 538 embedded in adhesives 516 and 536 can cause damage to the flex circuits 502 and 522 and/or conductive connections 504 and 524. In some examples, this compression can cause cracks in conductive connections 504 and 524 and/or in flex circuits 502 and 522 that reduce durability and/or reliability or reduce manufacturing yield. In some examples, the adhesives 1116 and 1136 that bond conductive connections 1104 and 1124 and/or 1124a-b to substrate 1110 in touch screen 1100 may not include conductive particles because the connection from the touch electrodes 1120 and 1140 to the touch electrodes 1120 and 1140 is made by vias 1118 and 1138. Thus, for example, touch screen 1100 may not be compressed to the same degree that touch screen 500 is compressed during fabrication, which can reduce or prevent damage to flex circuits 1102 and 1122 and/or conductive connections 1104 and 1124 and/or 1124a-b.

FIGS. 13A-13E illustrate fabrication of exemplary touch screen 1100 according to some examples of the disclosure. In some examples, FIGS. 13A-13E can be cross-sections of touch screen 1100 during fabrication. For example, via 1118 can be formed according to the examples in FIGS. 13A-13E. As described above with reference to FIG. 11, in some examples, via 1118 can be used to coupled flex circuit 1102 to touch electrodes 1120 (e.g., drive electrodes).

Figure 13A:
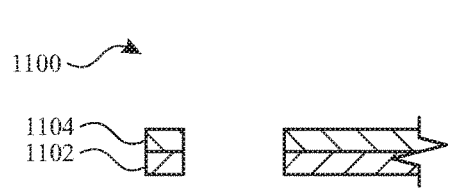
FIGS. 13A-13E illustrate fabrication of exemplary touch screen according to some examples of the disclosure.

In FIG. 13A, touch screen 1100 can include flex circuit 1102 and conductive connection 1104, for example. In some examples, a hole can be formed through flex circuit 1102 and conductive connection 1104 before the flex circuit 1102 and conductive connection 1104 are coupled to other components of the touch screen 1100. In some examples, the hole through the conductive connection 1104 can be formed using a photolithography process. In some examples, the hole through the flex circuit 1102 and/or conductive connection 1104 can be formed using die cut punching and/or a laser (e.g., a UV laser). It should be understood that FIGS. 13A-13E can be a cross-section of the flex circuit 1102 and conductive connection 1104 at a location of a hole through flex circuit 1102 and conductive connection 1104 and, at a different cross-section of touch screen 1100, the portions of flex circuit 1102 and conductive connection 1104 illustrated in FIGS. 13A-13E can be connected.

Figure 13B:
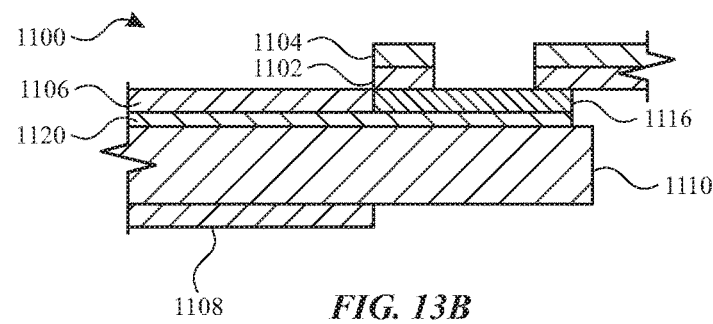

In some examples, such as in FIG. 13B, flex circuit 1102 and conductive connection 1104 can be bonded to substrate 1110, touch electrodes 1120, and passivation 1106 and 1108 by adhesive 1116 using low pressure bonding (e.g., NCF bonding) or other suitable technique(s). As shown in FIG. 13B, adhesive 1116 can be disposed between a portion of flex circuit 1102 and touch electrodes 1120.

Figure 13C:
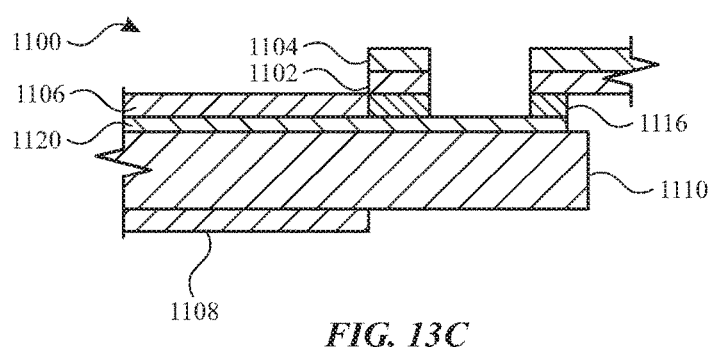

In FIG. 13C, in some examples, a hole can be formed through adhesive 1116 that at least partially aligns with the holes through flex circuit 1102 and conductive connection 1104. In some examples, selective laser drilling can be used to form the hole through adhesive 1116. For example, conductive connection 1104 can act as a mask and the laser may not affect touch electrodes 1120 because the laser may be able to remove the adhesive 1116 material without removing conductive material, such as metal, included in conductive connection 1104 and touch electrodes 1120. In some examples, flex circuit 1102 can be joined to substrate 1110 before a hole is drilled through flex circuit 1102 and after a hole has been formed through conductive connection 1104 (e.g., using photolithography). In some examples, selective laser drilling (e.g., with a $CO_2$ laser) can be used to form a hole through flex circuit 1102 and adhesive 1116. In some examples, the selective laser drilling process can use the hole through conductive connection 1104 as a mask to form the holes through flex circuit 1102 and adhesive 1116 because the laser may not form a hole through the conductive material of conductive connection 1104. In some examples, the laser stops drilling at the touch electrodes 1120 because the laser may not form holes through the touch electrodes 1120.

Figure 13D:
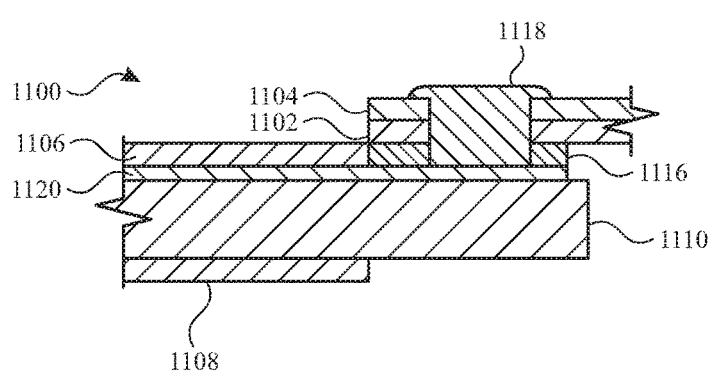
Figure 13E:
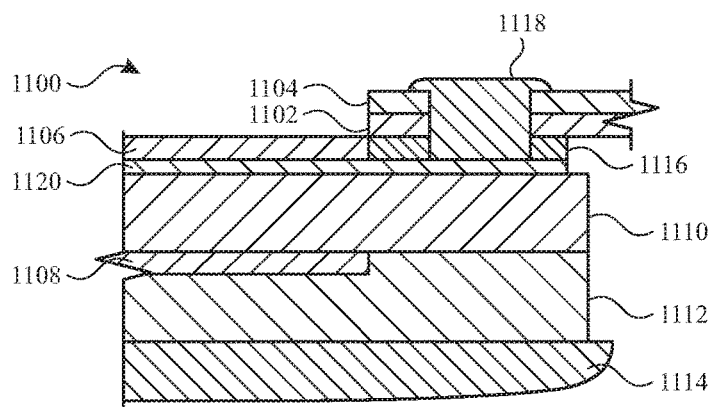

In some examples, in FIG. 13D, via 1118 can be filled with a conductive material (e.g., conductive paste, such as silver paste or copper paste, conductive ink, wire). The conductive material of via 1118 can electrically couple flex circuit 1102 to touch electrodes 1120 through conductive connection 1104. In some examples, such as in FIG. 13E, cover material 1114 can be coupled to substrate 1110 by adhesive 1112.

FIGS. 14A-14E illustrate fabrication of exemplary touch screen 1100 according to some examples of the disclosure. For example, via 1138 illustrated in FIG. 12A can be formed according to the examples in FIGS. 14A-14E. In some examples, FIGS. 14A-14E can be cross-sections of touch screen 1100 during fabrication. As described above with reference to FIGS. 12A-12C, in some examples, via 1138 can be used to couple flex circuit 1122 to touch electrodes 1140 (e.g., sense electrodes) through adhesive 1136 and substrate 1110 by way of conductive connection 1124.

Figure 14A:
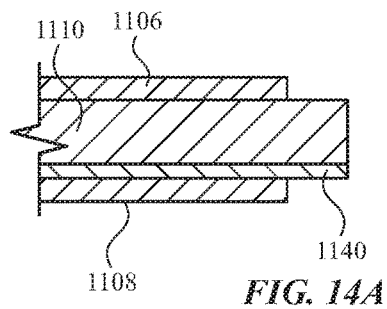
FIGS. 14A-14E illustrate fabrication of exemplary touch screen according to some examples of the disclosure.

In FIG. 14A, touch screen 1100 can include substrate 1110, touch electrodes 1140, and passivation 1106 and 1108, for example. In some examples, substrate 1110 can include a hole through which via 1138 can eventually be formed. For example, the hole through substrate 1110 can be formed by laser drilling or another suitable technique. It should be understood that FIGS. 14A-14E can illustrate cross-sections of touch screen 1100 at a location including a hole through substrate 1110 and, at other locations of touch screen 1100 not shown in FIGS. 14A-14E, the portions of substrate 1100 shown in FIGS. 14A-14E can be coupled together.

Figure 14B:
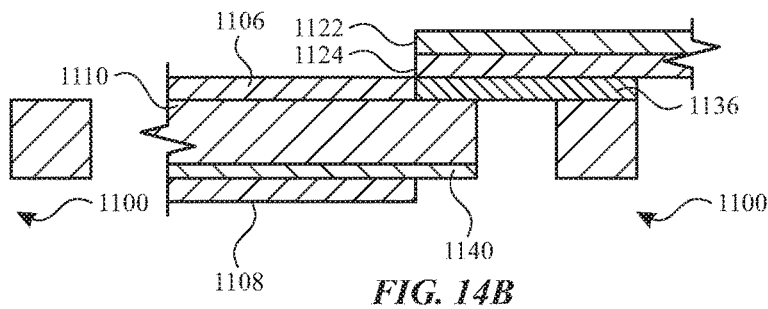

In some examples, such as in FIG. 14B, conductive connection 1124 and flex circuit 1122 can be bonded to substrate 1110 by adhesive 1136 using low pressure bonding (e.g., NCF bonding) or other suitable technique(s). In some examples, flex circuit 1122 and conductive connection 1124 are coupled to the touch screen 1100 such that the conductive connection 1124 is between flex circuit 1122 and substrate 1110.

Figure 14C:
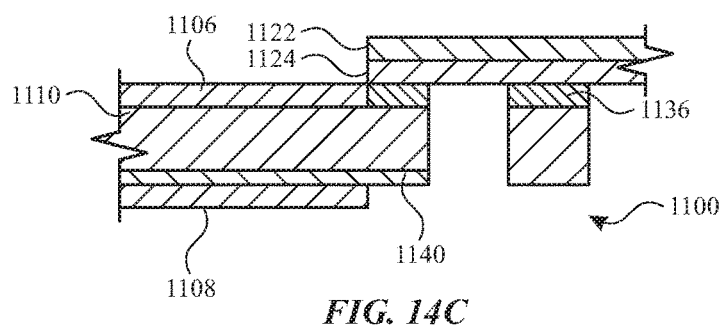

In FIG. 14C, in some examples, a hole can be formed through adhesive 1136. In some examples, selective laser drilling can be used to create the hole through adhesive 1136 without creating a hole through conductive connection 1124. For example, the laser can be configured to remove the material of the adhesive 1136 without removing conductive materials, such as the material of conductive connection 1124 (e.g., copper, silver, gold, etc.).

Figure 14D:
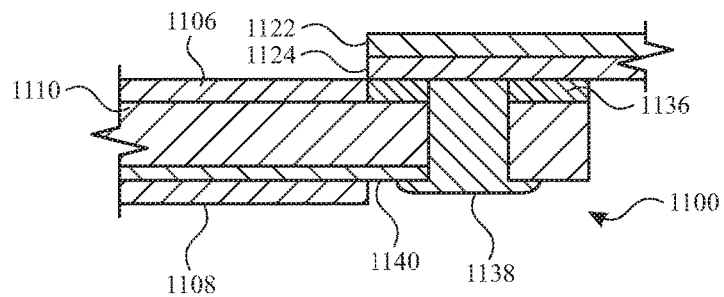

In some examples, in FIG. 14D, via 1138 can be filled with a conductive material, such as a conductive material (e.g., conductive paste, such as silver paste or copper paste, conductive ink, wire). The conductive material of via 1138 can make contact with touch electrodes 1140 and conductive connection 1124 to electrically couple touch electrodes 1140 to flex circuit 1122 by way of conductive connection 1124, for example.

Figure 14E:
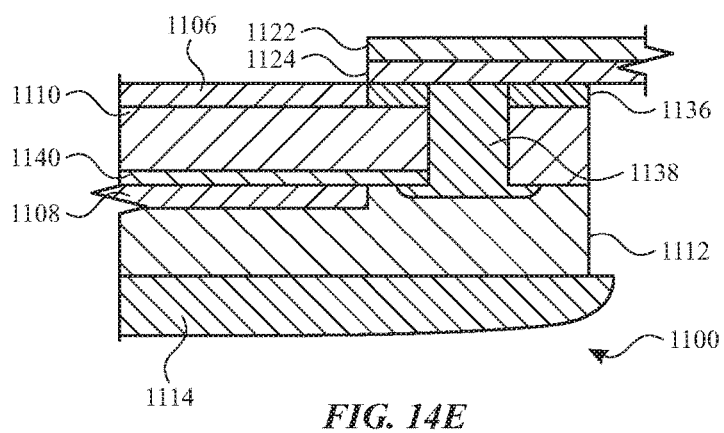

In FIG. 14E, in some examples, cover material 1114 can be coupled to the rest of touch screen 1100 using adhesive 1112. In some examples, the cover material 1114 can be attached to the rest of touch screen 1100 such that the substrate 1110 is between flex circuit 1122 and cover material 1114 and touch electrodes 1140 can be between substrate 1110 and cover material 114.

It should be understood that, in some examples, the one or more operations described with reference to FIGS. 13A-13E and the one or more operations described with reference to FIGS. 14A-14E can be performed with respect to a single touch screen 1100. In some examples, the touch screen 1100 can include a plurality of touch electrodes 1120 and a plurality of touch electrodes 1140 and each touch electrode can be coupled to flex circuits 1102 and 1122 (by way of conductive connections 1104 and 1124) using vias 1118 and 1138. Thus, in some examples, the operations described above with reference to FIGS. 13A-14E can be repeated or performed multiple times concurrently to couple all touch electrodes 1120 and 1140 to the flex circuits 1102 and 1122 with vias 1118 and 1138. In some examples, the operations described with reference to FIGS. 13A-13E can be performed in series with, concurrently with, or in an alternating manner with the operations described with reference to FIGS. 14A-14E. Thus, in some examples, the operations described with reference to FIGS. 13A-14E can be used to fabricate a touch screen 1100 that includes touch electrodes 1120 and 1140, conductive connections 1104 and 1124, and flex circuits 1102 and 1122. Modifications to the operations described with reference to FIGS. 13A-14E can be made without departing from the scope of the disclosure in some examples.

Figure 15:
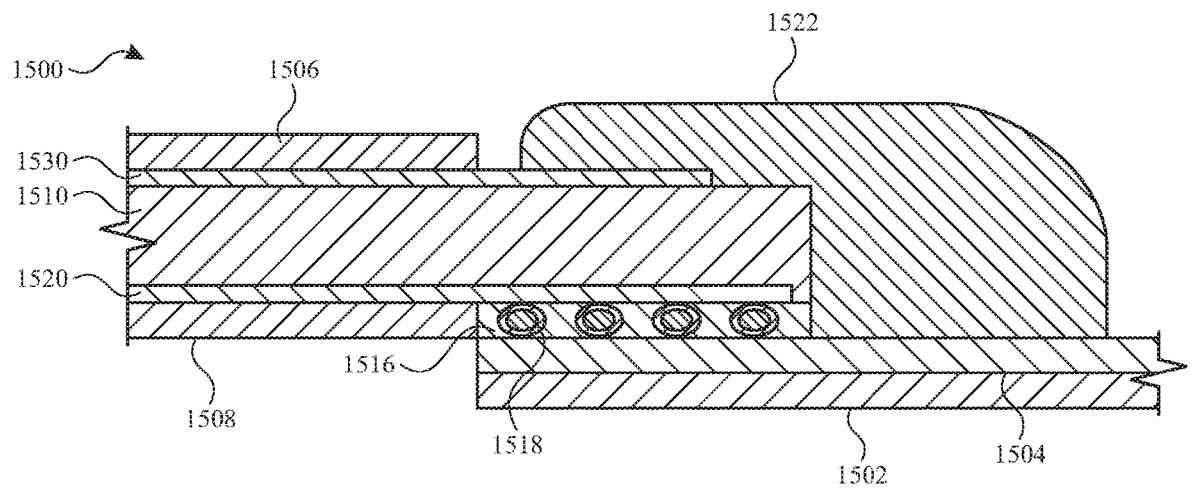
FIG. 15 illustrates a cross section of an exemplary touch screen according to some examples of the disclosure.

FIG. 15 illustrates a cross section of an exemplary touch screen 1500 according to some examples of the disclosure. Touch screen 1500 can include substrate 1510, electrodes 1520 and 1530, passivation 1506 and 1508, adhesive 1516 with conductive particles 1518, conductive connection 1504, flex circuit 1502, and conductive connection 1522, for example.

In some examples, touch screen 1500 can include touch electrodes (e.g., electrodes 1520) in one layer of the touch screen stackup, instead of two layers of touch electrodes, such as in touch screens 500, 600 and/or 1100. For example, electrodes 1520 can be touch electrodes and electrodes 1530 can be coupled to a reference voltage, such as ground. In some examples, electrodes 1520 can be coupled to the reference voltage and electrodes 1530 can be touch electrodes. In some examples, touch screen 1500 can sense touch using self-capacitance or mutual capacitance and the touch electrodes can be patterned as shown in FIG. 4B. In some examples, electrodes 1520 and 1530 can include a transparent conductive material, such as ITO (indium tin oxide) or another fully, substantially, or partially transparent metal oxide. In some examples, the electrodes 1520 and 1530 can include opaque conductive materials, such as metals (e.g., copper, gold, silver, etc.). For example, touch screen 1500 can include an active area in which touch can be sensed and images can be displayed and a border region at least partially surrounding the active area in which images may not be displayed and touch may not be sensed. In some examples, the touch electrodes can include transparent portions disposed in the active area and opaque portions disposed in the border region. In some examples, the portions of the touch electrodes illustrated in FIG. 15 can include opaque portions of the touch electrodes. In some examples, the electrodes 1520 and 1530 can include metal mesh structures, such as silver nanowire mesh.

In some examples, substrate 1510 can include a transparent material, such as a transparent plastic. Substrate 1510 can provide mechanical support to the other components of the touch screen 1500, for example. It should be understood that, in some examples, substrate 1510 can include a plurality of substrates joined together with adhesives so that electrodes 1520 are attached to one of the substrates and electrodes 1530 are attached to the another one of the substrates.

In some examples, passivation layers 1506 and 1508 can include a transparent insulating material. For example, the passivation layers 1506 and 1508 can protect other components of the touch screen 1500 from corrosion.

In some examples, conductive connection 1504 of flex circuit 1502 can be electrically coupled to electrodes 1520 and electrodes 1510. For example, conductive connect 1504 and flex circuit 1502 can be coupled to touch screen 1500 using adhesive 1516 using low pressure bonding (e.g., NCF bonding) or other suitable technique(s). In some examples, adhesive 1516 can include an electrically insulating material. In some examples, conductive particles 1518 can be embedded in adhesive 1516 to form electrical connections between electrodes 1520 and conductive connection 1504. In some examples, electrodes 1510 can be coupled to conductive connection 1504 by conductive connection 1522. Conductive connection 1522 can include a conductive material (e.g., conductive paste, such as silver paste or copper paste, conductive ink, wire).

Therefore, in some examples, electrodes 1530 and 1520 of touch screen 1500 can be coupled to flex circuit 1502 through conductive connection 1504 in the manners described above. In some examples, portion(s) of conductive connection 1504 that are not in contact with adhesive 1516 or conductive connection 1522 can be vulnerable to corrosion. In some examples, it can be advantageous to use a different structure to connect electrodes 1530 to flex circuit 1502 to avoid corrosion.

Figure 16A:
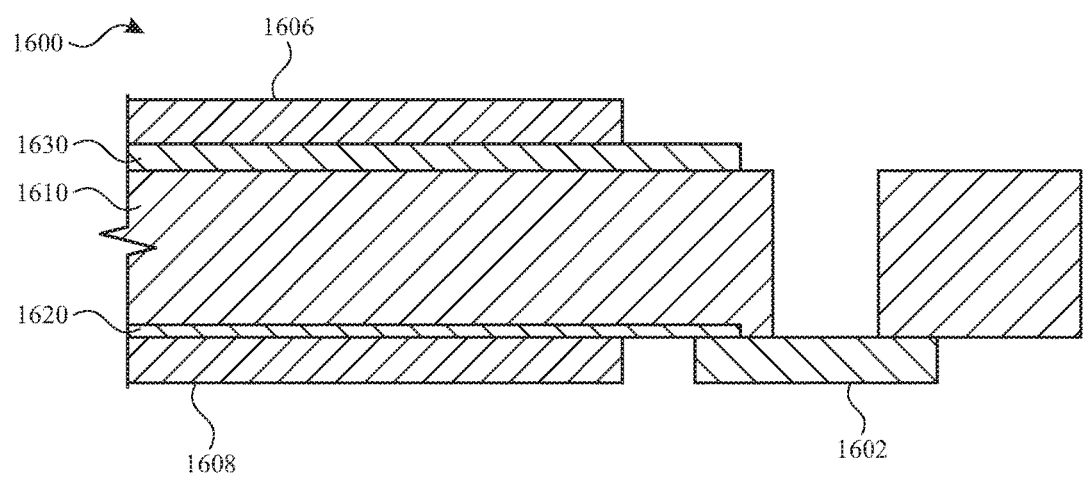
FIGS. 16A-16B illustrate cross sections of exemplary touch screen according to some examples of the disclosure.
Figure 16B:
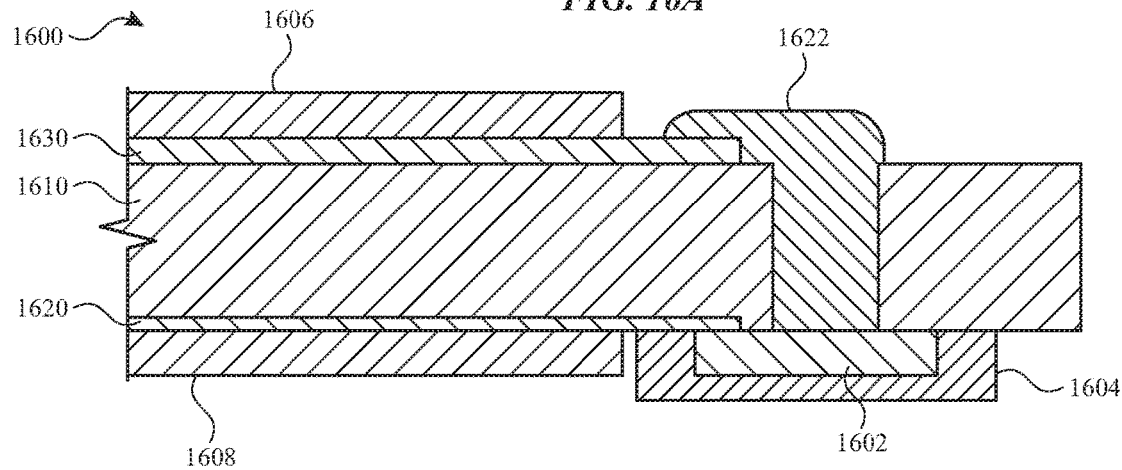

FIGS. 16A-16B illustrate cross sections of exemplary touch screen 1600 according to some examples of the disclosure. For example, touch screen 1600 can be fabricated according to a process that includes the structures shown in FIGS. 16A-16B.

In FIG. 16A, touch screen 1600 can include substrate 1610, electrodes 1620 and 1630, passivation 1606 and 1608, and conductive connection 1602, for example. In some examples, substrate 1610, electrodes 1620 and 1630, and passivation 1606 and 1608 can be similar to substrate 1510, electrodes 1520 and 1530, and passivation 1506 and 1508, respectively, described above with reference to FIG. 15 with the differences noted herein.

In some examples, conductive connection 1602 can include a conductive material (e.g., a metal such as copper, silver, etc.) and can connect to touch circuitry of touch screen 1600 (not shown). As shown in FIG. 16A, in some examples, conductive connection 1602 can be in contact with electrodes 1608 (e.g., touch electrodes). As will be described in more detail below with reference to FIG. 16B, conductive connection 1602 can be electrically coupled to electrodes 1630 (e.g., reference or ground electrodes) through substrate 1610 using via 1622.

Referring to FIG. 16A, in some examples, substrate 1610 can include a hole at a location on substrate 1610 at which conductive connection 1602 can be disposed. In some examples, the hole can be formed using selective laser drilling while the conductive connection 1602 is coupled to substrate 1610. For example, a laser can be applied to the substrate on the surface opposite the surface of the substrate 1610 to which conductive connection 1602 is coupled. The laser can remove the material of the substrate 1610 without removing or damaging the material of conductive connection 1602.

In FIG. 16B, touch screen 1600 can include the components described with reference to FIG. 16A plus a conductive filling of via 1622 and conformal coating 1604. In some examples, via 1622 can be filled with a conductive material, such as conductive paste (e.g., silver paste or copper paste), conductive ink, and/or wire(s), for example. The conductive material can form an electrical connection between electrodes 1630 (e.g., reference or ground electrodes) and conductive connection 1602, for example. In some examples, electrodes 1620 (e.g., touch electrodes) are also coupled to conductive connection 1602. Thus, in some examples, electrodes 1630 and electrodes 1620 can be coupled together. In some examples, the portion of electrodes 1620 (e.g., touch electrodes) coupled to electrodes 1630 (e.g., reference or ground electrodes) can be a reference electrode in the touch electrode layer. In some examples, conformal coating 1604 can include an electrically insulating material and can be disposed such that conductive connection 1602 is between substrate 1610 and conformal coating 1604. Conformal coating 1604 can protect conductive connection 1602 from corrosion and other forms of damage, for example.

Figure 17:
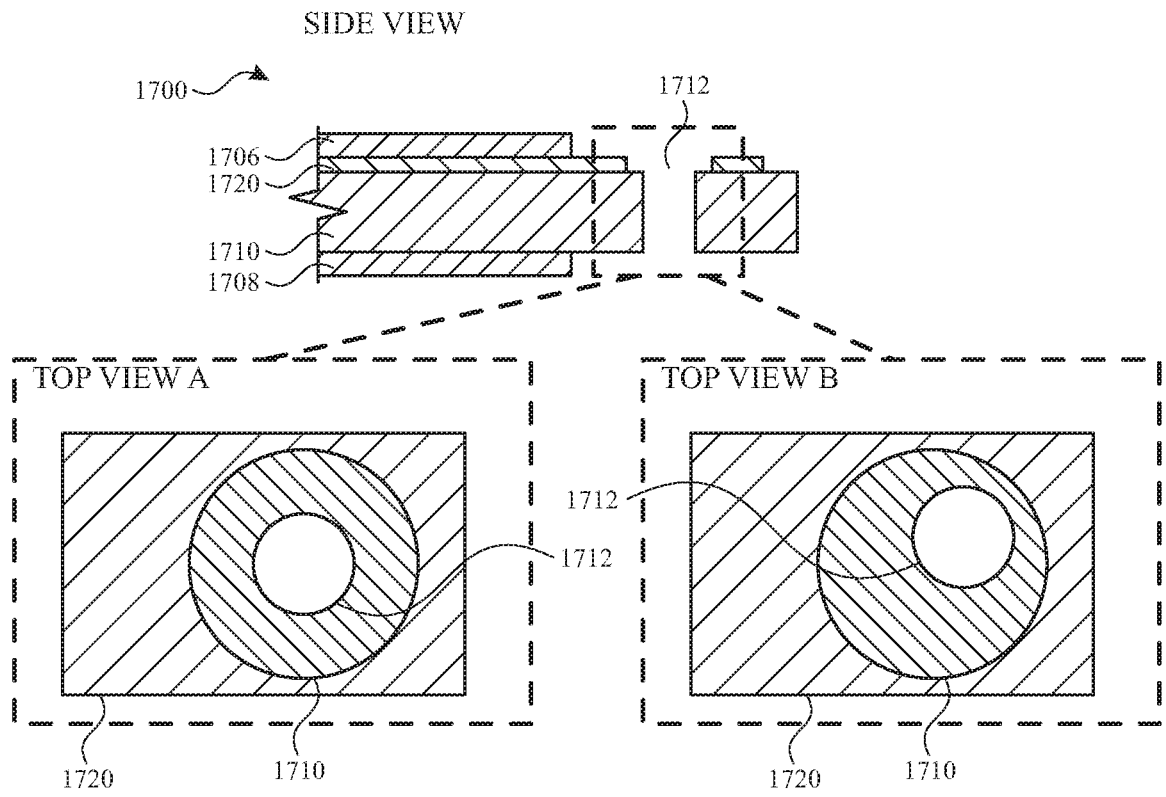
FIG. 17 illustrates formation of a hole through a substrate of an exemplary touch screen according to some examples of the disclosure.

FIG. 17 illustrates formation of a hole 1712 through a substrate 1710 of an exemplary touch screen 1700 according to some examples of the disclosure. In some examples, the technique illustrated in FIG. 17 includes forming the hole 1712 with a laser. In some examples, the laser can remove a variety of materials including plastics and metals, though the techniques described with reference to FIG. 17 can also be implemented using selective laser drilling in which some materials (e.g., plastics) can be removed while other materials (e.g., metals) are not removed.

In FIG. 17, the touch screen 1700 can include a substrate 1710, electrodes 1720, and passivation 1706 and 1708. In some examples, substrate 1710, electrodes 1720, and passivation 1706 and 1708 can be similar to substrates 510, 610, 710, 1110, 1510, or 1610, electrodes 520, 620, 720, 1120, 1530, or 1630, and passivation 506, 508, 606, 608, 1106, 1108, 1506, 1508, 1606, or 1608, respectively, as described above with reference to FIGS. 5-14B. In some examples, the techniques described with reference to FIG. 17 can be applied to one of the touch screens 500, 600, 1100, 1500, or 1600 described above.

In some examples, electrodes 1720 can be patterned to include touch electrodes (e.g., as shown in FIGS. 4A-4B) and a hole at the location of hole 1712 in FIG. 17. For example, electrodes 1720 can be patterned before electrodes 1720 are joined to substrate 1710. In some examples, once electrodes 1720 can be joined to substrate 1710, a hole 1712 can be formed through substrate 1710 at the location of the hole through electrodes 1720. In some examples, the hole 1712 through substrate 1710 can be aligned with the hole through touch electrodes 1720 as shown in TOP VIEW A (e.g., the centers of the holes can be aligned or within a threshold distance of each other). In some examples, the hole 1712 through substrate 1710 can be aligned with the hole through touch electrodes 1720 as shown in TOP VIEW B (e.g., the centers of the holes can be at different locations or more than a threshold distance of each other). In some embodiments, it can be difficult for all touch screen 1700 units to include the alignment shown in TOP VIEW A. Thus, in some embodiments, other techniques can be used to form a hole through a substrate that is aligned with a hole through the touch electrodes.

Figure 18:
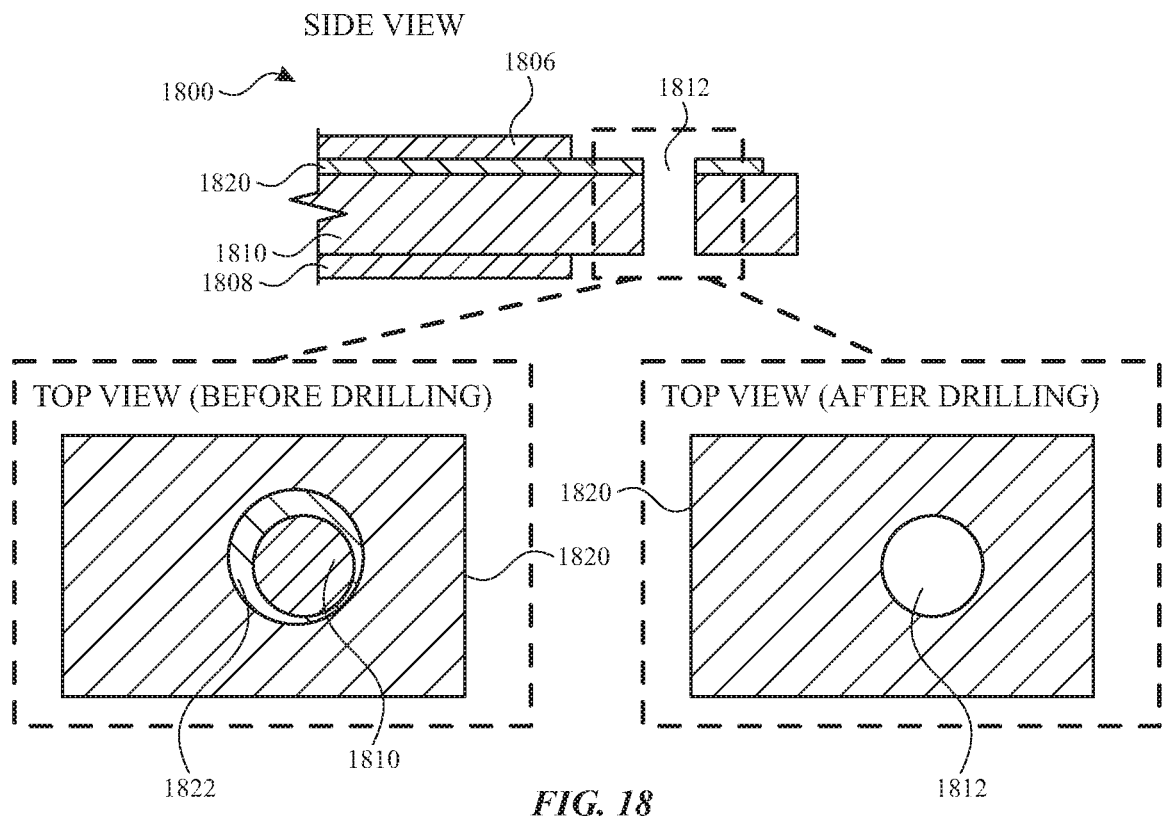
FIG. 18 illustrates formation of a hole through a substrate of an exemplary touch screen according to some examples of the disclosure.

FIG. 18 illustrates formation of a hole 1812 through a substrate 1810 of an exemplary touch screen 1800 according to some examples of the disclosure. In some examples, the technique illustrated in FIG. 18 includes forming the hole 1812 with a laser. In some examples, the techniques described with reference to FIG. 18 can be implemented using selective laser drilling in which some materials (e.g., plastics) can be removed while other materials (e.g., metals) are not removed.

In FIG. 18, the touch screen 1800 can include a substrate 1810, electrodes 1820, and passivation 1806 and 1808. In some examples, substrate 1810, electrodes 1820, and passivation 1806 and 1808 can be similar to substrates 510, 610, 710, 1110, 1510, or 1610, electrodes 520, 620, 720, 1120, 1530, or 1630, and passivation 506, 508, 606, 608, 1106, 1108, 1506, 1508, 1606, or 1608, respectively, as described above with reference to FIGS. 5-14B. In some examples, the techniques described with reference to FIG. 17 can be applied to one of the touch screens 500, 600, 1100, 1500, or 1600 described above.

In some examples, electrodes 1820 can be patterned to include touch electrodes (e.g., as shown in FIGS. 4A-4B) and a hole at the location of hole 1812 in FIG. 18. For example, electrodes 1820 can be patterned before electrodes 1820 are joined to substrate 1810. In some examples, once electrodes 1820 can be joined to substrate 1810, a hole 1812 can be formed through substrate 1810 at the location of the hole through electrodes 1820 using selective laser drilling. In some examples, the laser can remove some materials (e.g., plastics) and may not remove other materials (e.g., metals). For example, the laser can remove the material of the substrate 1810 without removing the material of the touch electrodes 1820. Thus, in some examples, the touch electrodes 1820 can be used as a mask when forming the hole 1812 through substrate 1810. For example, as shown in the TOP VIEW (BEFORE DRILLING), the laser beam 1822 can have a diameter that is wider than the diameter of the hole in the touch electrodes 1720 through which substrate 1810 can be visible. As shown in the TOP VIEW (AFTER DRILLING), the hole 1812 through the substrate can be aligned with the hole through touch electrodes 1820 without removing additional material from the touch electrodes 1820, for example.

Some examples of the disclosure are directed to a touch screen, comprising: a first touch electrode; a first flex circuit coupled to first touch circuitry, the first flex circuit including a conductive connection; a first via including a conductive material, the first via configured to electrically couple the first touch electrode to the conductive connection of the first flex circuit, the first via disposed through at least a first portion of the touch screen, the conductive material of the first via being in direct contact with the conductive connection of the first flex circuit. Additionally or alternatively, in some examples the touch screen does not include an adhesive between the conductive material of the first via and the conductive connection of the first flex circuit at a location at which the conductive material of the first via is coupled to the conductive connection of the first flex circuit. Additionally or alternatively, in some examples the touch screen includes a substrate at least partially disposed between the first touch electrode and the conductive connection of the first flex circuit, wherein the first via is disposed through the substrate. Additionally or alternatively, in some examples the touch screen includes a substrate, the flex circuit is bonded to the substrate using an adhesive disposed between the flex circuit and the substrate, and the via is disposed through the adhesive and the substrate. Additionally or alternatively, in some examples the touch screen includes a second touch electrode; a substrate disposed between the first touch electrode and the second touch electrode; a second flex circuit coupled to second touch circuitry, the second flex circuit including a second conductive connection; a second via including a conductive material, the second via configured to electrically couple the second touch electrode to the conductive connection of the second flex circuit, the second via disposed through at least a second portion of the touch screen, the conductive material of the second via being in direct contact with the conductive connection of the second flex circuit, wherein the substrate is between the first touch electrode and the conductive connection of the second flex circuit. Additionally or alternatively, in some examples the touch screen includes a cover material, wherein: the conductive connection of the first flex circuit and the conductive connection of the second flex circuit are both disposed between the substrate and the cover material. Additionally or alternatively, in some examples the touch screen includes a cover material, the substrate is disposed between the conductive connection of the first flex circuit and the cover material, and the substrate is disposed between the conductive connection of the second flex circuit and the cover material. Additionally or alternatively, in some examples the first portion of the touch screen through which the first via is disposed includes the substrate, and the second portion of the touch screen through which the second via is disposed does not include the substrate. Additionally or alternatively, in some examples the first via is disposed through the first flex circuit. Additionally or alternatively, in some examples the touch screen includes a reference electrode coupled to a reference voltage; and a substrate disposed between the first touch electrode and the reference electrode, wherein the substrate is disposed between the first touch electrode and the conductive connection of the first flex circuit, wherein the first via is formed through the substrate.

Some examples of the disclosure are directed to a portable consumer electronic device comprising an energy storage device; communication circuitry; and a touch screen including: a first touch electrode; a first flex circuit coupled to first touch circuitry, the first flex circuit including a conductive connection; a first via including a conductive material, the first via configured to electrically couple the first touch electrode to the conductive connection of the first flex circuit, the first via disposed through at least a first portion of the touch screen, the conductive material of the first via being in direct contact with the conductive connection of the first flex circuit. Additionally or alternatively, in some examples the touch screen does not include an adhesive between the conductive material of the first via and the conductive connection of the first flex circuit at a location at which the conductive material of the first via is coupled to the conductive connection of the first flex circuit. Additionally or alternatively, in some examples, the touch screen further comprises: a substrate at least partially disposed between the first touch electrode and the conductive connection of the first flex circuit, wherein the first via is disposed through the substrate. Additionally or alternatively, in some examples the touch screen further comprises a substrate, wherein: the flex circuit is bonded to the substrate using an adhesive disposed between the flex circuit and the substrate, and the via is disposed through the adhesive and the substrate. Additionally or alternatively, in some examples the touch screen further comprises: a second touch electrode; a substrate disposed between the first touch electrode and the second touch electrode; a second flex circuit coupled to second touch circuitry, the second flex circuit including a second conductive connection; a second via including a conductive material, the second via configured to electrically couple the second touch electrode to the conductive connection of the second flex circuit, the second via disposed through at least a second portion of the touch screen, the conductive material of the second via being in direct contact with the conductive connection of the second flex circuit, wherein the substrate is between the first touch electrode and the conductive connection of the second flex circuit. Additionally or alternatively, in some examples the touch screen further comprises a cover material, wherein: the conductive connection of the first flex circuit and the conductive connection of the second flex circuit are both disposed between the substrate and the cover material. Additionally or alternatively, in some examples the touch screen further comprises a cover material, wherein the substrate is disposed between the conductive connection of the first flex circuit and the cover material, and the substrate is disposed between the conductive connection of the second flex circuit and the cover material. Additionally or alternatively, in some examples the first portion of the touch screen through which the first via is disposed includes the substrate, and the second portion of the touch screen through which the second via is disposed does not include the substrate. Additionally or alternatively, in some examples the first via is disposed through the first flex circuit. Additionally or alternatively, in some examples the touch screen further comprises: a reference electrode coupled to a reference voltage; and a substrate disposed between the first touch electrode and the reference electrode, wherein the substrate is disposed between the first touch electrode and the conductive connection of the first flex circuit, wherein the first via is formed through the substrate.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. A touch screen, comprising:
   a substrate;
   a first touch electrode on a first side of the substrate;
   a second touch electrode on a second side of the substrate different from the first side of the substrate;
   a first flex circuit coupled to first touch circuitry, the first flex circuit including a conductive connection, wherein the first touch electrode and the conductive connection of the first flex circuit are disposed on a same side of the substrate in the touch screen; and
   a first via including a conductive material, the first via configured to electrically couple the first touch electrode to the conductive connection of the first flex circuit, the first via disposed through at least a first portion of the touch screen, the conductive material of the first via being in direct contact with the conductive connection of the first flex circuit.

2. The touch screen of claim 1, wherein the touch screen does not include an adhesive between the conductive material of the first via and the conductive connection of the first flex circuit at a location at which the conductive material of the first via is coupled to the conductive connection of the first flex circuit.

3. The touch screen of claim 1, further comprising:
   a second touch electrode;
   a second flex circuit coupled to second touch circuitry, the second flex circuit including a conductive connection; and
   a second via including a conductive material, the second via configured to electrically couple the second touch electrode to the conductive connection of the second flex circuit, wherein:
   the second flex circuit is bonded to the substrate using an adhesive disposed between the second flex circuit and the substrate, and
   the second via is disposed through the adhesive and the substrate.

4. The touch screen of claim 1, further comprising:
   a second touch electrode, wherein the substrate is disposed between the first touch electrode and the second touch electrode;
   a second flex circuit coupled to second touch circuitry, the second flex circuit including a second conductive connection; and
   a second via including a conductive material, the second via configured to electrically couple the second touch electrode to the conductive connection of the second flex circuit, the second via disposed through at least a second portion of the touch screen, the conductive material of the second via being in direct contact with the conductive connection of the second flex circuit, wherein the substrate is between the first touch electrode and the conductive connection of the second flex circuit.

5. The touch screen of claim 4, further comprising a cover material, wherein:
   the conductive connection of the first flex circuit and the conductive connection of the second flex circuit are both disposed between the substrate and the cover material.

6. The touch screen of claim 4, further comprising a cover material, wherein:
the substrate is disposed between the conductive connection of the first flex circuit and the cover material, and
the substrate is disposed between the conductive connection of the second flex circuit and the cover material.

7. The touch screen of claim 4, wherein:
the second portion of the touch screen through which the second via is disposed includes the substrate, and
the first portion of the touch screen through which the first via is disposed does not include the substrate.

8. The touch screen of claim 1, wherein the first via is disposed through the first flex circuit.

9. The touch screen of claim 1, further comprising:
a second touch electrode;
a second flex circuit coupled to second touch circuitry, the second flex circuit including a conductive connection;
a second via including a conductive material, the second via configured to electrically couple the second touch electrode to the conductive connection of the second flex circuit;
a reference electrode coupled to a reference voltage; and
a substrate disposed between the second touch electrode and the reference electrode, wherein the substrate is disposed between the second touch electrode and the conductive connection of the second flex circuit, wherein the second via is formed through the substrate.

10. A portable consumer electronic device comprising:
an energy storage device;
communication circuitry; and
a touch screen including:
a substrate;
a first touch electrode on a first side of the substrate;
a second touch electrode on a second side of the substrate different from the first side of the substrate;
a first flex circuit coupled to first touch circuitry, the first flex circuit including a conductive connection, wherein the first touch electrode and the conductive connection of the first flex circuit are disposed on a same side of the substrate in the touch screen; and
a first via including a conductive material, the first via configured to electrically couple the first touch electrode to the conductive connection of the first flex circuit, the first via disposed through at least a first portion of the touch screen, the conductive material of the first via being in direct contact with the conductive connection of the first flex circuit.

11. The portable consumer electronic device of claim 10, wherein the touch screen does not include an adhesive between the conductive material of the first via and the conductive connection of the first flex circuit at a location at which the conductive material of the first via is coupled to the conductive connection of the first flex circuit.

12. The portable consumer electronic device of claim 10, wherein the touch screen further comprises:
a second touch electrode;
a second flex circuit coupled to second touch circuitry, the second flex circuit including a conductive connection; and
a second via including a conductive material, the second via configured to electrically couple the second touch electrode to the conductive connection of the second flex circuit, wherein:

the second flex circuit is bonded to the substrate using an adhesive disposed between the second flex circuit and the substrate, and
the second via is disposed through the adhesive and the substrate.

13. The portable consumer electronic device of claim 10, wherein the touch screen further comprises:
a second touch electrode, wherein the substrate is disposed between the first touch electrode and the second touch electrode;
a second flex circuit coupled to second touch circuitry, the second flex circuit including a second conductive connection; and
a second via including a conductive material, the second via configured to electrically couple the second touch electrode to the conductive connection of the second flex circuit, the second via disposed through at least a second portion of the touch screen, the conductive material of the second via being in direct contact with the conductive connection of the second flex circuit, wherein the substrate is between the first touch electrode and the conductive connection of the second flex circuit.

14. The portable consumer electronic device of claim 13, wherein the touch screen further comprises a cover material, wherein:
the conductive connection of the first flex circuit and the conductive connection of the second flex circuit are both disposed between the substrate and the cover material.

15. The portable consumer electronic device of claim 13, wherein the touch screen further comprises a cover material, wherein:
the substrate is disposed between the conductive connection of the first flex circuit and the cover material, and
the substrate is disposed between the conductive connection of the second flex circuit and the cover material.

16. The portable consumer electronic device of claim 13, wherein:
the second portion of the touch screen through which the second via is disposed includes the substrate, and
the first portion of the touch screen through which the first via is disposed does not include the substrate.

17. The portable consumer electronic device of claim 10, wherein the first via is disposed through the first flex circuit.

18. The portable consumer electronic device of claim 10, wherein the touch screen further comprises:
a second touch electrode;
a second flex circuit coupled to second touch circuitry, the second flex circuit including a conductive connection;
a second via including a conductive material, the second via configured to electrically couple the second touch electrode to the conductive connection of the second flex circuit;
a reference electrode coupled to a reference voltage; and
a substrate disposed between the second touch electrode and the reference electrode, wherein the substrate is disposed between the second touch electrode and the conductive connection of the second flex circuit, wherein the second via is formed through the substrate.

* * * * *